(12) United States Patent
Lynch

(10) Patent No.: US 12,362,765 B2
(45) Date of Patent: Jul. 15, 2025

(54) COOPERATIVE COMPRESSION IN DISTRIBUTED DATABASES

(71) Applicant: NETFLIX, INC., Los Gatos, CA (US)

(72) Inventor: Joseph Lynch, Gaithersburg, MD (US)

(73) Assignee: NETFLIX, INC., Los Gatos, CA (US)

( * ) Notice: Subject to any disclaimer, the term of this patent is extended or adjusted under 35 U.S.C. 154(b) by 264 days.

(21) Appl. No.: 18/304,242

(22) Filed: Apr. 20, 2023

(65) Prior Publication Data

US 2023/0344446 A1 Oct. 26, 2023

Related U.S. Application Data

(60) Provisional application No. 63/334,600, filed on Apr. 25, 2022.

(51) Int. Cl.
*H03M 7/30* (2006.01)
*H03M 7/40* (2006.01)

(52) U.S. Cl.
CPC ....... *H03M 7/3088* (2013.01); *H03M 7/4062* (2013.01); *H03M 7/6052* (2013.01)

(58) Field of Classification Search
CPC . H03M 7/3088; H03M 7/6052; H03M 7/4062
USPC .............................................. 341/51, 87, 106
See application file for complete search history.

(56) References Cited

U.S. PATENT DOCUMENTS

| | | | |
|---|---|---|---|
| 11,405,054 B1 * | 8/2022 | Micou | H04L 69/04 |
| 11,463,559 B1 * | 10/2022 | Agarwal | H04L 69/04 |

OTHER PUBLICATIONS

Handte et al, "5 Ways Facebook Improved Compression at Scale With Zstandard", Dec. 19, 2018, 10 pages, available at https://engineering.fb.com/2018/12/19/core-data/zstandard/.

* cited by examiner

*Primary Examiner* — Khai M Nguyen
(74) *Attorney, Agent, or Firm* — Artegis Law Group, LLP

(57) ABSTRACT

In various embodiments a computer-implemented method for managing use of a shared compression dictionary in a distributed database environment. The method includes determining that a given version of the shared compression dictionary should be designated as a current primary version of the shared compression dictionary. The method also includes receiving, from a client device, first write data compressed with a previous primary version of the shared compression dictionary and in response to receiving the first write data, transmitting, to the client device, the current primary version of the shared compression dictionary and an instruction to compress new write data with the current primary version of the shared compression dictionary. Additionally, the method includes receiving, from the client device, a second write data compressed with the current primary version of the shared compression dictionary and storing the second write data in a database.

20 Claims, 8 Drawing Sheets

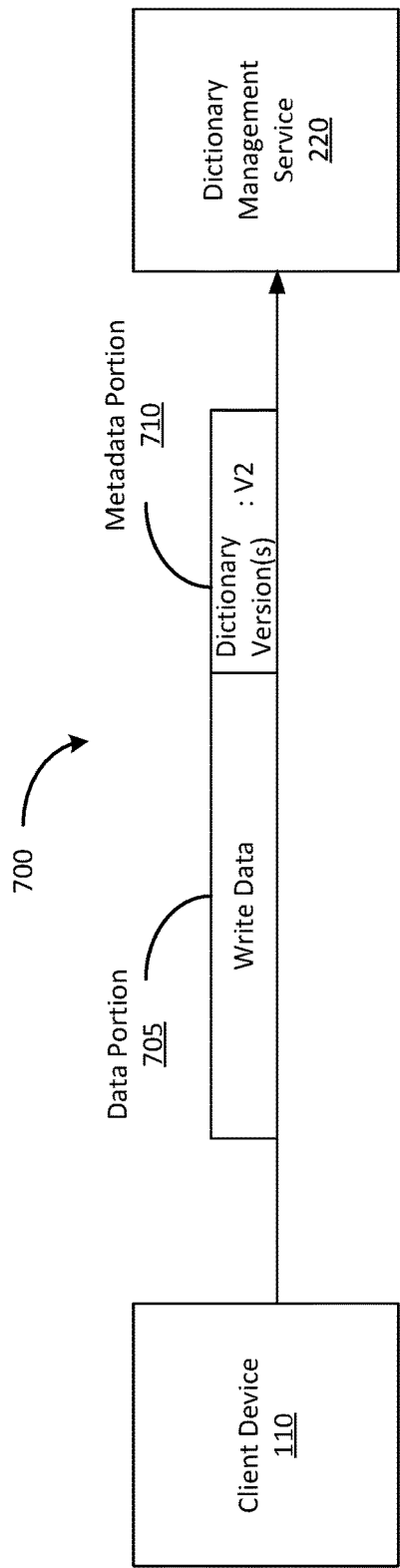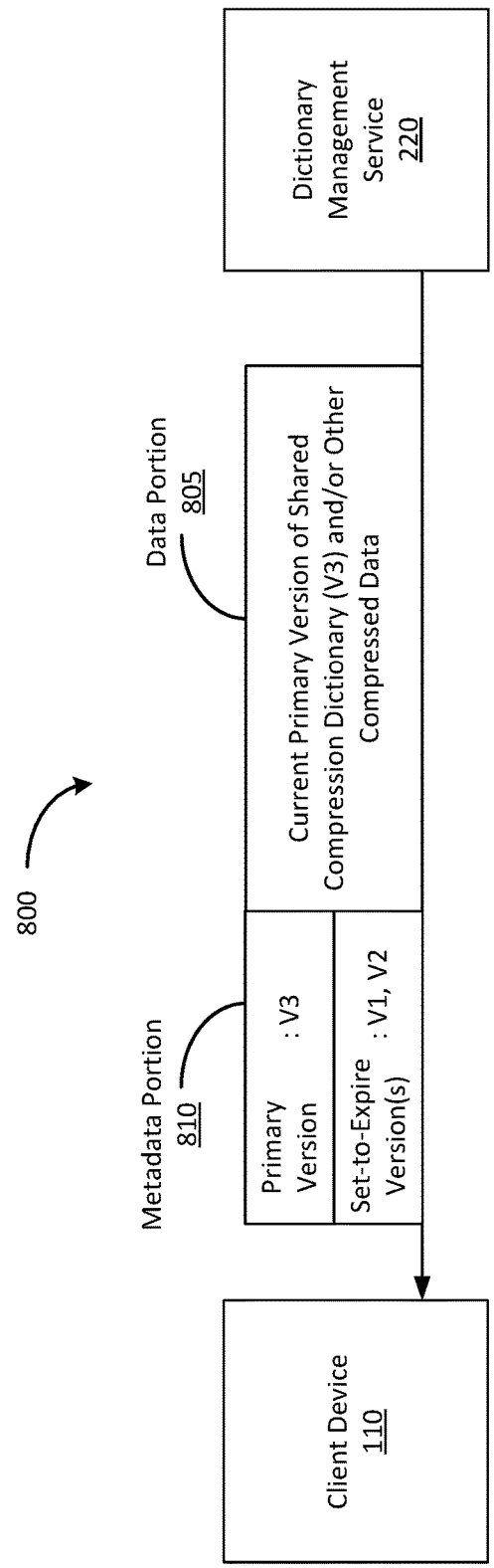

US 12,362,765 B2

COOPERATIVE COMPRESSION IN DISTRIBUTED DATABASES

CROSS-REFERENCE TO RELATED APPLICATIONS

This application claims priority benefit of the United States Provisional Patent Application titled, "COOPERATIVE COMPRESSION IN DISTRIBUTED DATABASES," filed on Apr. 25, 2022 and having Ser. No. 63/334,600. The subject matter of this related application is hereby incorporated herein by reference.

BACKGROUND

Technical Field

Embodiments of the present disclosure relate generally to data compression and, more specifically, to cooperative compression in distributed databases.

Description of the Related Art

A database is an organized collection of data that is stored and accessed electronically. When storing data in a database, the data can be compressed to reduce the amount of database storage needed to store the data. Data compression is the process of encoding information by using fewer bits than the amount of bits that were used in the original representation of the data. Compression in databases can be performed at the server(s) on which the database executes (referred to herein as "server-side compression") or at the clients of the database ("client-side compression").

In server-side compression, data received from the clients of a database is compressed by one or more database servers. When compared to client-side compression, server-side compression can achieve better compression ratios because the servers generally operate on larger pieces of data (e.g., 64 kb blocks) at a given time. Thus, while compressing large pieces of data, servers can more easily identify frequently occurring information within the data being compressed, thereby improving the compression ratio. In addition, the server-side compression is more efficient than client-side compression because there are larger amounts of physical memory available at the server side.

However, there are various drawbacks associated with server-side compression that make scaling the computing resources and network demands of a database both difficult and expensive. For example, when compared to client-side compression, server-side compression consumes a large amount of a database's central processing unit (CPU) resources. In addition, when compression and decompression is performed at the server side, network bandwidth is strained by the large amounts of uncompressed data being transmitted between database servers and clients.

An alternative to server-side compression involves the clients of a database compressing data before sending the data to the database servers. The client CPU resources needed to compress data are cheap and easy to scale relative to the CPU resources of database servers. In addition, as the data is compressed before transmission over a network, client-side compression reduces the size of data being transmitted over the network thereby conserving network bandwidth. For these reasons, client-side compression may be more desirable relative to server-side compression. However, when compared to server-side compression, client-side compression is often less effective because individual clients only have knowledge of their data and no knowledge of the remaining data stored in the database. As a result, compression is performed in an ad-hoc manner and does not result in compression ratios similar to server-side compression operations. This is particularly problematic for small data on the order of hundreds of bytes.

More recently, some databases support client-side compression with the use of compression dictionaries. For example, a client device uses a compression dictionary to compress data before transmitting the compressed data to the server. A compression dictionary, which may hereinafter simply be referred to as a "dictionary," is a mapping of frequently occurring values, or patterns, in a piece of data to the associated tokens that are used to replace the frequently occurring patterns in a compressed data format. With the use of dictionary-based compression, client-side compression has been able to achieve higher compression ratios, even when compressing smaller pieces of data.

Although the use of compression dictionaries has helped to alleviate some of the above-described drawbacks that are respectively associated with server-side and client-side compression, managing and distributing compression dictionaries across database servers and clients is a complex problem. For example, when implementing dictionary-based compression and decompression, a dictionary that is used to compress a block of data has to be maintained and made available at a later time for decompression of that data block. However, if an individual entity is responsible for managing shared compression dictionaries, the entity has no way of knowing when old dictionaries can be expired. In addition, if the entity mistakenly expires or otherwise loses a shared compression dictionary, all data stored in the database that was compressed with the lost shared compression dictionary is effectively lost as well.

As the foregoing illustrates, what is needed in the art are more effective techniques for managing client side compression with the use of shared dictionaries.

SUMMARY

One embodiment sets forth a computer-implemented method for managing use of a shared compression dictionary in a distributed database environment. The method includes determining that a given version of the shared compression dictionary should be designated as a current primary version of the shared compression dictionary. The method also includes receiving, from a client device, a first write data compressed with a previous primary version of the shared compression dictionary and in response to receiving the first write data, transmitting, to the client device, the current primary version of the shared compression dictionary and an instruction to compress new write data with the current primary version of the shared compression dictionary. Additionally, the method includes receiving, from the client device, a second write data compressed with the current primary version of the shared compression dictionary and storing the second write data in a database.

At least one technical advantage of the disclosed techniques relative to the prior art is that, in the disclosed techniques, effective compression can be achieved primarily with client-side compression without the drawbacks associated with conventional client-side or server-side compression methods. In particular, in the disclosed techniques, all shared dictionaries are managed on the database server side. In this regard, the risk of losing data stored in the database because a client inadvertently expired or otherwise lost a dictionary that was used to compress the stored data is eliminated. Moreover, by managing the shared compression dictionaries on the server side, database servers can instruct all clients of the database to start using new dictionaries and/or to expire old dictionaries, thereby reducing the amount of client-side storage that is wasted on storing dictionaries that are not in use. At least another technical advantage of the disclosed techniques relative to the prior art is that, in the disclosed techniques, database servers can re-write stored data using newer versions of the shared compression dictionary during routine compaction processes. In this regard, old versions of the shared compression dictionary can be expired deterministically as the database servers re-write, using newer versions of the shared compression dictionary, data that was compressed with the old versions of the shared compression dictionary.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 illustrates an example of a signal transmitted from a client device to a server in the distributed database environment of FIG. 1, according to various embodiments of the present disclosure;

FIG. 8 illustrates an example of a signal transmitted from a server to a client device in the distributed database environment of FIG. 1, according to various embodiments of the present disclosure;

DETAILED DESCRIPTION

In the following description, numerous specific details are set forth to provide a more thorough understanding of the embodiments of the present invention. However, it will be apparent to one of skill in the art that the embodiments of the present invention may be practiced without one or more of these specific details.

System Overview

Figure 1:
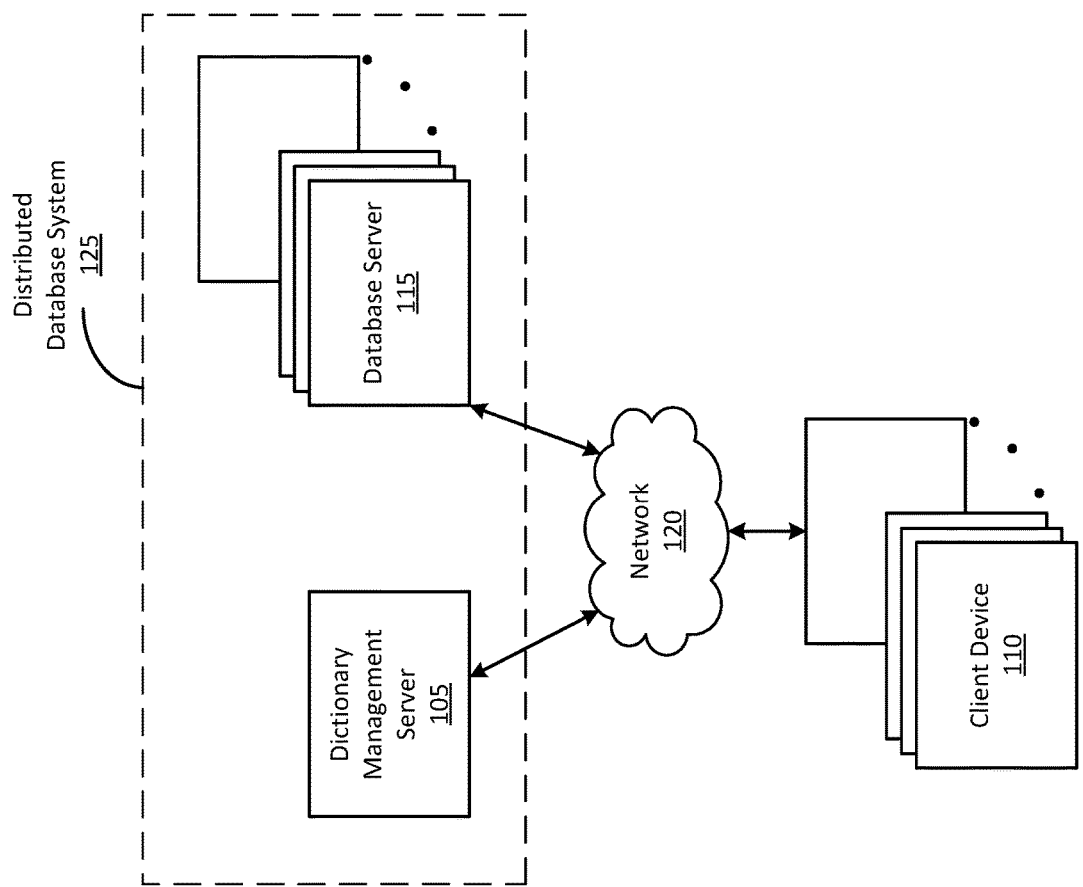
FIG. 1 illustrates a distributed database environment, according to various embodiments of the invention.

FIG. 1 illustrates a distributed database environment 100, according to various embodiments of the invention. As shown, the distributed database environment 100 includes a dictionary management server 105, client devices 110, and database servers 115, each of which are connected via a communications network 120. In the following description, client devices 110 may be referred to individually as client device 110 and database servers 115 may be referred to individually as database server 115.

Each client device 110 communicates with the dictionary management server 105 via the network 120 to write data to and retrieve data from one or more database servers 115 (also referred to as "caches" or "nodes"). For example, the dictionary management server 105 operates as an intermediary layer between the client devices 110 and database servers 115 when client devices 110 write data to and retrieve data from the database servers 115. Data stored in the one or more database servers 115 can include, without limitation, textual data, graphical data, audio data, video data, and other types of data. As will be described in more detail below, dictionary management server 105 manages compression dictionaries to enable client devices 110 to use a correct version of a compression dictionary when writing data to or retrieving data from one or more database servers 115. Although only a single dictionary management server 105 is shown in FIG. 1, in various embodiments, multiple dictionary management servers 105 may be implemented to manage compression and decompression of data transmitted between client devices 110 and database servers 115.

As shown further shown in FIG. 1, the dictionary management server 105 and database servers 115 combine to form a distributed database system 125. In some embodiments, the dictionary management server 105 is implemented as one or more of the database servers 115 included in the distributed database system 125. In such embodiments, the one or more database servers 115 perform actions, such as managing compression dictionaries, that are described herein as being performed by the dictionary management server 105. In some embodiments, the dictionary management server 105 is integrated within one or more of the database servers 115. In some embodiments, the dictionary management server 105 is implemented as a service, or application, running on one or more of the database servers 115. Persons skilled in the art will understand that although the dictionary management functions are primarily described herein with respect to the dictionary management server 105, in some embodiments, description of dictionary management functions performed by the dictionary management server 105 are also applicable to one or more of the database servers 115. For example, in some embodiments, each database server 115 is configured to perform the dictionary management functions described herein with respect to the dictionary management server 105.

Within the distributed database environment 100, messages, such as write data and read data, transmitted between the dictionary management server 105, the client devices 110, and/or the database servers 115 are compressed with a shared compression dictionary before transmission. For example, a respective client device 110 compresses write data with the shared compression dictionary before transmitting the write data to the dictionary management server 105 and/or a database server 115 for storage. Similarly, the respective client device 110 decompresses read data retrieved from the dictionary management server 105 and/or a database server 115 with the shared compression dictionary.

The shared compression dictionary is the compression dictionary with which all devices coupled to the distributed database environment 100 (e.g., the dictionary management server 105, the client devices 110, and the database servers 115) compress write data and decompress read data. Multiple versions of the shared compression dictionary may exist at a given time. Thus, to prevent use of an incorrect version of the shared compression dictionary, such as an outdated and/or expired version, the dictionary management server 105 instructs the client devices 110 and database servers 115 to use a correct version of the shared compression dictionary. The correct version of the shared compression dictionary may be the most up-to-date version and/or the primary version of the shared compression dictionary, which will be described in more detail below with respect to FIG. 3.

For example, a new version of the shared compression dictionary may be trained, by the dictionary management server 105 and/or one or more database servers 115, and designated by the dictionary management server 105 as the correct version of the shared compression dictionary. Accordingly, in this example, the dictionary management server 105 instructs the client devices 110 and/or database servers 115 to stop compressing write data with a previous version of the shared compression dictionary and start compressing new write data with the new, correct version of the dictionary management server 105. In addition, when the dictionary management server 105 determines that an old version of the shared compression dictionary is no longer needed, the dictionary management server 105 may also instruct the client devices 110 and/or the database server 115 to expire the old version of the shared compression dictionary.

Figure 2:
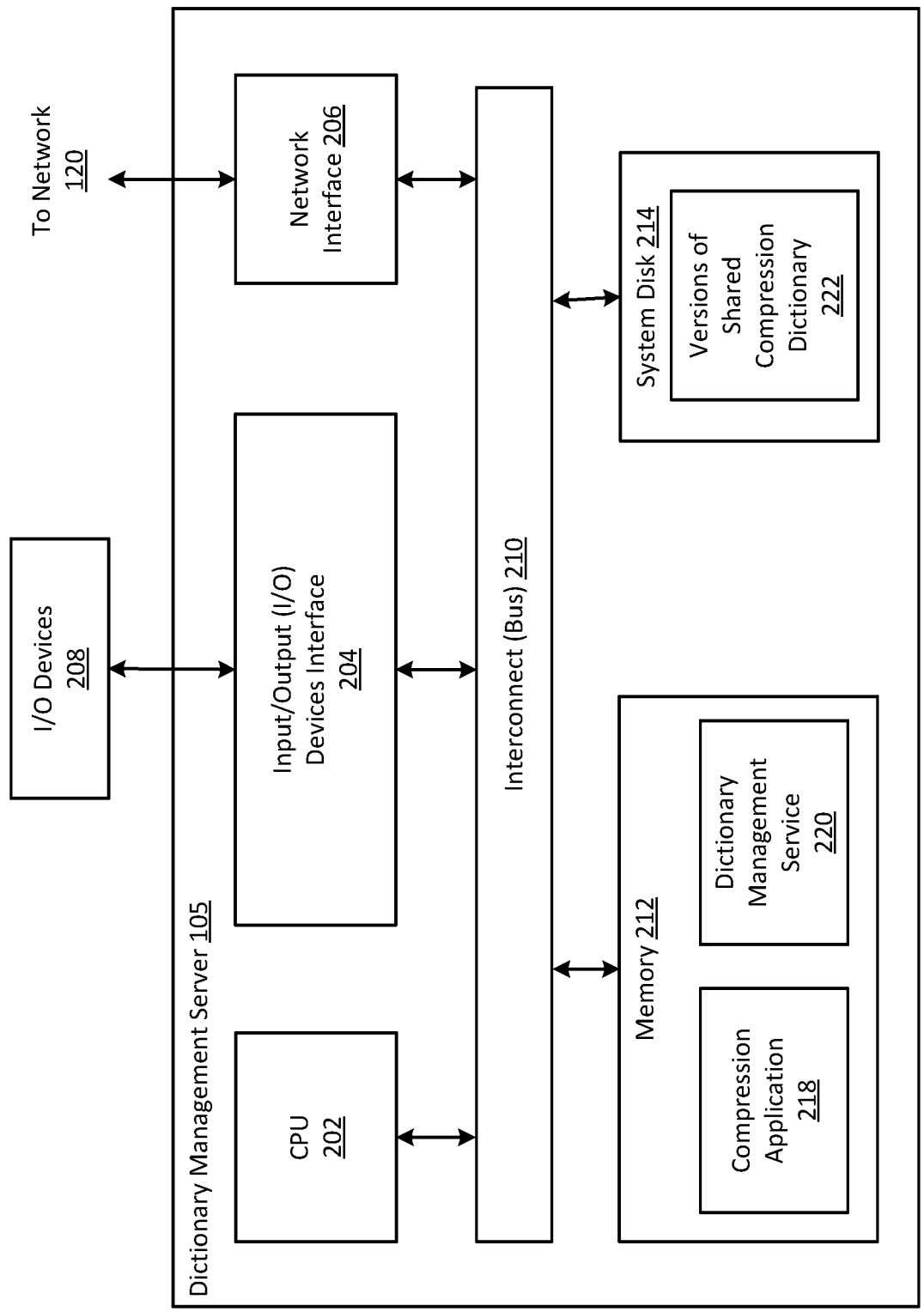
FIG. 2 is a block diagram of a dictionary management server that may be implemented in conjunction with the distributed database environment of FIG. 1, according to various embodiments of the present invention.

FIG. 2 is a block diagram of a dictionary management server 105 that may be implemented in conjunction with the distributed database environment 100 of FIG. 1, according to various embodiments of the present invention. The dictionary management server 105 manages the shared compression dictionaries that are used for compressing and decompressing data transmitted between client devices 110 and database servers 115. As described above, in some embodiments, the dictionary management server 105 is implemented as a database server 115 and/or a service running on a database server 115. In such embodiments, the following description of the dictionary management server 105 is also applicable to database servers 115 that perform the dictionary management functions described below.

As shown, the dictionary management server 105 includes, without limitation, a central processing unit (CPU) 202, an input/output (I/O) devices interface 204, a network interface 206, I/O devices 208, an interconnect 210, a system memory 212, and a system disk 214. The CPU 202 is configured to retrieve and execute programming instructions, such as compression application 218 and dictionary management service 220, stored in the system memory 212. Similarly, the CPU 202 is configured to store application data (e.g., software libraries) and retrieve application data from the system memory 212. The interconnect 210 is configured to facilitate transmission of data, such as programming instructions and application data, between the CPU 202, I/O devices interface 204, the network interface 206, the system memory 212, and the system disk 214. The I/O devices interface 204 is configured to receive input data from I/O devices 208 and transmit the input data to the CPU 202 via the interconnect 210. For example, I/O devices 208 may include one or more buttons, a keyboard, a mouse, and/or other input devices. The I/O devices interface 204 is further configured to receive output data from the CPU 202 via the interconnect 210 and transmit the output data to the I/O devices 208.

The system disk 214 may include one or more hard disk drives, solid state storage devices, or similar storage devices. The system disk 214 is configured to store non-volatile data such as files (e.g., audio files, video files, subtitles, application files, software libraries, etc.). As shown in FIG. 2, the system disk 214 is further configured to store one or more versions of a shared compression dictionary 222. As will be discussed in more detail below, one or more versions of the shared compression dictionary 222 are managed by the dictionary management server 105 and shared across all devices, including client devices 110 and database servers 115, coupled to distributed database environment 100. For example, the one or more versions of the shared compression dictionary 222 can be transmitted to and/or retrieved by one or more client devices 110 and/or one or more database servers 115 via the network 120.

The system memory 212 includes a compression application 218 and a dictionary management service 220. Using the shared compression dictionary 222, the compression application 218 compresses uncompressed write data received from client devices 110 before storing the write data in a database server 115 and/or compresses uncompressed read data retrieved from a database server 115 before transmitting the read data to a client device 110. The compression application 218 coordinates with the dictionary management service 220 to determine which version of the shared compression dictionary 222 is a correct version of the shared compression dictionary 222 that should be used to compress the write data transmitted by a client device 110. Compression application 218 may use any known dictionary-based compression algorithm, such as zstd or LZ4, when compressing write data received from client devices 110.

The dictionary management service 220 manages the use of the shared compression dictionary 222 across all client devices 110 and/or database servers 115 coupled to the distributed database environment 100. For example, the dictionary management service 220 instructs the client devices 110 and/or database servers 115 on the specific version of the shared compression dictionary 222 that should be used to compress new write data. When client devices 110 and/or database servers 115 do not possess the correct version of the shared compression dictionary 222 that should be used to compress new write data, the dictionary management service 220 transmits the correct version of the shared compression dictionary 222 to the client devices 110 and/or the database servers 115. Furthermore, the dictionary management service 220 expires old versions of the shared compression dictionary 222 that are no longer needed. The expiring process involves instructing client devices 110 to delete the expired versions of the shared compression dictionary 222 from their respective memory systems and/or expiring old versions of the shared compression dictionary 222 as compressed data stored in the database server(s) 115 is re-written, or re-compressed, using newer versions of the shared compression dictionary 222.

Figure 3:
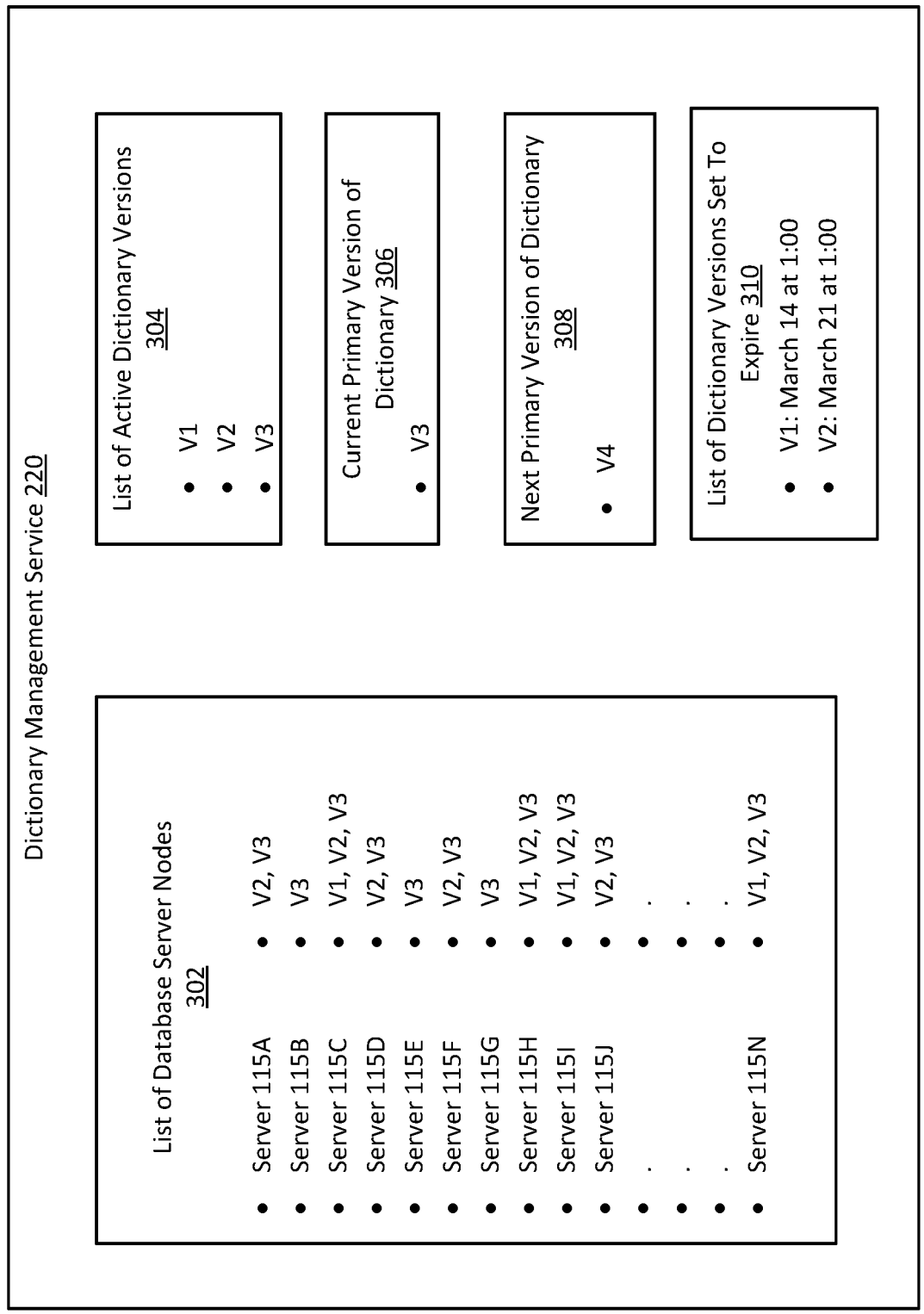
FIG. 3 is a block diagram of a dictionary management service that may be implemented by the dictionary management server of FIG. 2, according to various embodiments of the present invention.

FIG. 3 is a block diagram of the dictionary management service 220 that may be implemented by the dictionary management server 105 in conjunction with the distributed database environment 100 of FIG. 1, according to various embodiments of the present invention. Although dictionary management service 220 is described and shown as running on the dictionary management server 105, as described above, in some embodiments, the dictionary management service 220 runs on one or more of the database servers 115. In some embodiments, the dictionary management service 220 runs on the dictionary management server 105 and one or more of the database servers 115.

As shown, the dictionary management service 220 maintains a list of database server nodes 302. The list of database server nodes 302 includes every database server 115 that is currently active within the distributed database environment 100. Each entry in the list of database server nodes 302 includes an identifier associated with a particular server node (e.g., server 115A, server 115B, etc.) and a corresponding list of versions of the shared compression dictionary 222 that were used to compress data that is currently stored in the particular server node. In some embodiments, the list of database server nodes 302 is implemented as a table that is stored in and/or otherwise accessible to all dictionary management servers 105 and/or database servers 115 on which the dictionary management service 220 is running.

In the illustrated example, the first entry in the list of database server nodes 302 indicates that database server 115A is coupled to the distributed database environment 100 and is currently storing data that was compressed with version two (V2) of the shared compression dictionary 222 and data that was compressed with version three (V3) of the shared compression dictionary 222. As another example, a later entry in the illustrated list of database server nodes 302 indicates that database server 115H is coupled to the distributed database environment 100 and is currently storing data that was compressed with version one (V1) of the shared compression dictionary 222, data that was compressed with V2 of the shared compression dictionary 222, and data that was compressed with V3 of the shared compression dictionary 222.

The version of the shared compression dictionary 222 that was used to compress data before storing the data in a database server 115 is also needed to decompress the data when the data is retrieved from database server 115. Thus, if the version of the shared compression dictionary 222 that was used to compress the data stored in a database server 115 cannot be accessed (e.g., was deleted), the data cannot be decompressed without losing some or all of the data. For example, server 115A is currently storing data that was compressed with V2 of the shared compression dictionary 222. Therefore, V2 of the shared compression dictionary 222 should not be deleted by dictionary management service 220 until all of the data stored in database server 115A that was compressed with V2 of the shared compression dictionary 222 is compacted and/or recompressed with a new version of the shared compression dictionary 222. Compacting data stored in the database server 115A with a new version of the shared compression dictionary 222 includes compressing the data stored in the database server 115A with the new version of the shared compression dictionary 222 to reduce that amount of storage space in database server 115A that is needed to store the data.

To avoid inadvertently deleting a version of the shared compression dictionary 222 that was used to compress data currently stored in one or more database servers 115, dictionary management service 220 maintains a list of active dictionary versions 304. An active version of the shared compression dictionary 222 is a version of the shared compression dictionary 222 that was used to compress data that is currently stored in one or more database servers 115. Therefore, the list of active dictionary versions 304 includes a list of all active versions of the shared compression dictionary 222. In some embodiments, the list of database server nodes 302 and the list of active dictionary versions 304 are integrated in a single list and/or table.

With respect to the illustrated example of FIG. 3, the list of active dictionary versions 304 includes V1, V2, and V3 of the shared compression dictionary 222. Notably, as shown in the list of database server nodes 302, V1, V2, and V3 are the only versions of the shared compression dictionary 222 that were used to compress data currently stored in the database servers 115. If an old version of the shared compression dictionary 222 was not used to compress data that is currently stored in a database server 115, that old version of the compression dictionary 222 is "inactive" and the dictionary management service 220 removes it from the list of active dictionary versions 304. For example, if it is assumed that version zero (V0) is an old, inactive version of the shared compression dictionary 222, dictionary management service 220 removed V0 from the list of active dictionary versions 304.

Dictionary management service 220 updates the list of database server nodes 302 and the list of active dictionary versions 304 at regular intervals or as needed. For embodiments in which the dictionary management service 220 is running on a database server 115, dictionary management service 220 updates the list of active dictionary versions 304 simply by determining which versions of the shared compression dictionary 222 have been used to compress data that is currently stored in the database server 115 on which dictionary management service 220 is running.

For embodiments in which the dictionary management service 220 is running on a dictionary management server 105 but not on the database servers 115, dictionary management service 220 communicates with the database servers 115 to determine the list of active dictionary versions 304. In some embodiments, when communicating with a database server 115, dictionary management service 220 uses in-band signaling to identify which versions of the shared compression dictionary 222 are active in the database server 115. In such embodiments, the versions of the shared compression dictionary 222 that are active in a database server 115 are included in the metadata, or some other portion, of signals transmitted from that database server 115 to the dictionary management server 105. Accordingly, dictionary management service 220 can identify which versions of the shared compression dictionary 222 are active in a particular database server 115 by reading the metadata included in a signal transmitted by that database server 115 to the dictionary management server 105. Thus, by reading metadata included in signals received from database servers 115, dictionary management service 220 can update the list of database server nodes 302 and the list of active dictionary versions 304 every time a signal is transmitted from a database server 115 to the dictionary management server 105. In other embodiments, dictionary management service 220 polls the database servers 115 to provide indications as to which versions of the shared compression dictionary 222 are active. In such embodiments, dictionary management service 220 polls the database servers 115 for this information periodically (e.g., every 30 seconds, every minute, every half hour, every hour, etc.) or on an ad-hoc basis.

The dictionary management service 220 further determines and keeps track of which version of the shared compression dictionary 222 is the primary version of the shared compression dictionary 222. The primary version of the shared compression dictionary 222 is the version of the shared compression dictionary 222 that should be used for compressing all new write data to the database servers 115. That is, when the dictionary management service 220 promotes a version of the shared compression dictionary 222 to be the primary version of the shared compression dictionary 222, any new write data by the dictionary management server 105, the client devices 110, and/or database servers 115 should be compressed using the new, current primary version of the shared compression dictionary 222. As shown in the illustrated example of FIG. 3, V3 is the current primary version 306 of the shared compression dictionary 222.

To cause client devices 110 to compress new write data with the current primary version of the shared compression dictionary 222, the dictionary management service 220 shares the current primary version of the shared compression dictionary 222 with the client devices 110. As will be described in more detail below with respect to FIGS. 6-8, in some embodiments, the dictionary management service 220 implements in-band signaling to determine whether a client device 110 possesses the current primary version of the shared compression dictionary 222.

In such embodiments, write data transmitted by a client device 110 includes metadata that indicates which version of the shared compression dictionary 222 was used by the client device 110 to compress the write data and/or which versions of the shared compression dictionary 222 are possessed by the client device 110. Accordingly, dictionary management service 220 can identify, based on the signal metadata, when a client device 110 is not using and/or does not possess the current primary version of the shared compression dictionary 222. In response to determining that a client device 110 compressed a write data with the incorrect version of the shared compression dictionary 222, the dictionary management service 220 transmits a signal including the current primary version of the shared compression dictionary 222, along with an instruction to compress all future write data with the current primary version of the shared compression dictionary 222, to the client device 110. In addition, the dictionary management service 220 instructs the compression application 218 to compress the received write data with the current primary version of the shared compression dictionary 222 before the write data is stored in a database server 115.

In some embodiments, the dictionary management service 220 polls client devices 110 to determine which versions of the shared compression dictionary 222 are actively being used by the client devices 110. In such embodiments, the dictionary management service 220 transmits a signal including the current primary version of the shared compression dictionary 222, along with an instruction to compress all write data with the current primary version of the shared compression dictionary 222, to the client devices 110 that are using incorrect versions of the shared compression dictionary 222. In such embodiments, the dictionary management service 220 polls the client devices 110 on a periodic basis (e.g., every 30 seconds, every minute, every half hour, every hour, etc.) and/or on an ad-hoc basis.

On occasion, the dictionary management service 220 determines that a new version of the shared compression dictionary 222 will be promoted to the primary version of the shared compression dictionary 222. A new version of the shared compression dictionary 222 may be created, or trained, by one or more database servers 115 and/or the dictionary management server 105. After a new version of the shared compression dictionary 222 is trained, the new version is stored, along with other versions of the shared compression dictionary 222, in system disk 214 of the dictionary management server 105.

In some embodiments, the dictionary management service 220 promotes a new version of the shared compression dictionary 222 to become the primary version of the shared compression dictionary 222 in response to determining that poor compression ratios are being achieved with the current primary version of the shared compression dictionary 222. In some embodiments, the dictionary management service 220 promotes a new version of the shared compression dictionary 222 to become the primary version of the shared compression dictionary 222 on a regular basis (e.g., weekly, monthly, etc.). With respect to the illustrated example of FIG. 3, dictionary management service 220 has determined that version four (V4) of the shared compression dictionary 222 will be the next primary version 308 of the shared compression dictionary 222.

In some embodiments, data stored in the database servers 115 is compacted to reduce the size of the data stored in the database servers 115 on a regular basis (e.g., weekly, monthly, etc.). During this compaction process, the dictionary management service 220 and/or one or more database servers 115 train a new version of the shared compression dictionary 222 and store the new version of the shared compression dictionary 222 in the system disk 214 of dictionary management server 105. Accordingly, in such embodiments, the dictionary management service 220 promotes this new version of the shared compression dictionary 222 that was trained during the compaction process to be the next primary version of the shared compression dictionary 222.

Before the dictionary management service 220 promotes the new version of the shared compression dictionary 222, the dictionary management service 220 publishes the new version of the shared compression dictionary 222 such that client devices 110 can retrieve the new version of the shared compression dictionary 222. For example, client devices 110 can retrieve the published new version of the shared compression dictionary 222 via polling. Moreover, the dictionary management service 220 provides enough time (e.g., minutes, hours, days, etc.) for client devices 110 to retrieve the new version of the shared compression dictionary 222 before the dictionary management service 220 promotes the new version to the primary version of the shared compression dictionary 222. After the new version of the shared compression dictionary 222 has been published for enough time, dictionary management service 220 promotes the new version to become the primary version of the shared compression dictionary 222 and instructs the client devices 110 to compress all future write data with this new primary version of the shared compression dictionary 222.

In some embodiments, instead of or in addition to using polling, the dictionary management service 220 uses in-band signaling to determine which client devices 110 still need the new version of the shared compression dictionary 222. In such embodiments, a write data transmitted by a client device 110 includes metadata that indicates which versions of the shared compression dictionary 222 are possessed by the client device 110. Accordingly, dictionary management service 220 can identify, based on the signal metadata, when a client device 110 has not yet received the new version of the shared compression dictionary 222 that will be promoted to the primary version. In response to determining that a client device 110 has not yet received the new version of the shared compression dictionary 222, the dictionary management service 220 transmits a signal including the new version of the shared compression dictionary 222, along with an instruction indicating a time at which the client device 110 should begin compressing write data with the new version of the shared compression dictionary 222, to the client device 110. The time at which the client device 110 should begin compressing write data with the new version of the shared compression dictionary 222 corresponds to the time at which the dictionary management service 220 will promote the new version of the shared compression dictionary 222 to become the primary version of the shared compression dictionary 222.

In addition, the dictionary management service 220 may expire an old version of the shared compression dictionary 222 that is no longer being used to compress new write data (e.g., versions of the compression dictionary 222 that have been demoted from primary version). With respect to the illustrated example of FIG. 3, the dictionary management service 220 maintains a list of dictionary versions that are set to expire 310. As shown, this list contains V1 and V2 of the shared compression dictionary 222. In some embodiments, dictionary management service 220 expires old versions of the shared compression dictionary 222 during the above-described compaction process. For example, in such embodiments, the dictionary management service 220 expires an old version of the shared compression dictionary 222 and data stored in a database server 115 that was compressed with the old version of the shared compression dictionary 222 is re-written, or re-compressed, with a newer version of the shared compression dictionary 222.

In some embodiments, when the dictionary management service 220 sets a version of the shared compression dictionary 222 to expire, the dictionary management service 220 does not immediately expire and delete the version. Instead, in such embodiments, the dictionary management service 220 schedules a time at which the version of the shared compression dictionary 222 will be expired. With respect to the illustrated example of FIG. 3, V1 of the shared compression dictionary 222 is scheduled to expire at 1:00 on March 14 and V2 of the shared compression dictionary 222 is scheduled to expire at 1:00 on March 21.

The dictionary management service 220 schedules an expiration time for the version of the shared compression dictionary 222 that provides enough time for data currently stored in the database servers 115 that was compressed with the set-to-expire version of the shared compression dictionary 222 to be compacted and/or recompressed with a new version (e.g., the primary version) of the shared compression dictionary 222. For example, the dictionary management service 220 may schedule an expiration time for a version of the shared compression dictionary to occur in a week, two weeks, a month, etc. In some embodiments, before expiring the version of the shared compression dictionary 222, the dictionary management service 220 verifies that the version of the shared compression dictionary 222 being expired is not included in the list of active dictionary versions 304. In such embodiments, if the dictionary management service 220 determines that the version of the shared compression dictionary 222 set to expire is still included in the list of active dictionary versions 304 at the scheduled expiration time, the dictionary management service 220 postpones expiring the version of the shared compression dictionary 222 until the version of the shared compression dictionary 222 is no longer included in the list of active dictionary versions 304.

In some embodiments, after expiring a version of the shared compression dictionary 222, the dictionary management service 220 deletes the expired version of the shared compression dictionary 222 from the system disk 214. In some embodiments, after expiring a version of the shared compression dictionary 222, the dictionary management service 220 waits a predetermined amount of time (e.g., a week, a month, etc.) before deleting the expired version of the shared compression dictionary 222 from the system disk 214. In some embodiments, after expiring a version of the shared compression dictionary 222, the dictionary management service 220 does not delete the expired version of the shared compression dictionary 222 from the system disk 214. In some embodiments, after expiring a version of the shared compression dictionary 222, the dictionary management service 220 stores the expired version of the shared compression dictionary 222 in a separate server, such as a database server 115.

Each version of the shared compression dictionary 222 occupies a relatively large amount of storage space. For example, an individual version of the shared compression dictionary 222 may have a size as large as a few megabytes. Although a few megabytes may not be large in comparison to the amount of storage provided by the system disks of the dictionary management server 105 or database servers 115, a few megabytes could take up a large portion of storage space in a client device 110. Thus, it would be disadvantageous for a client device 110 to waste storage space on old versions of the shared compression dictionary 222 that are no longer being used to compress new write data. However, an individual client device 110 does not have access to the list of active dictionary versions 304, and thus, cannot know whether it is safe to expire an old version of the shared compression dictionary 222. Accordingly, the dictionary management service 220 also manages expiration of old versions of the shared compression dictionary 222 across client devices 110 coupled to the distributed database environment 100.

When the dictionary management service 220 sets a version of the shared compression dictionary 222 to expire, the dictionary management service 220 then instructs the client devices 110 to expire that version of the shared compression dictionary 222. In some embodiments, after scheduling a time at which a version of the shared compression dictionary 222 will expire, the dictionary management service 220 immediately instructs the client devices 110 to delete that version of the shared compression dictionary 222 from their respective storage. In some embodiments, the dictionary management service 220 instructs the client devices 110 to delete the version of the shared compression dictionary 222 from their respective storage at the scheduled time at which the dictionary management service 220 will expire the version of the shared compression dictionary 222. In some embodiments, the dictionary management service 220 polls client devices 110 to determine which versions of the shared compression dictionary 222 are currently stored on the client devices 110. In such embodiments, in response to receiving a response from a client device 110 that indicates the client device 110 is currently storing a version of the shared compression dictionary 222 that has been set to expire and/or has already been expired, the dictionary management service 220 transmits a signal including an instruction to delete that version of the shared compression dictionary 222 to the client device 110.

In some embodiments, the dictionary management service 220 uses in-band signaling to instruct client devices 110 to delete versions of the shared compression dictionary 222 that are set to expire or that have already been expired. In such embodiments, a write data transmitted by a client device 110 includes metadata that indicates which versions of the shared compression dictionary 222 are currently stored on the client device 110. Accordingly, dictionary management service 220 can identify, based on the signal metadata, when a client device 110 is storing versions of the shared compression dictionary 222 that have been set to expire or have already been expired. In response to determining that a client device 110 is storing versions of the shared compression dictionary 222 that have been set to expire or have already been expired, the dictionary management service 220 transmits a signal to the client device 110 that instructs the client device to delete the versions of the shared compression dictionary 222 that are set to expire or have already been expired from storage. Accordingly, by using in-band signaling in this manner, the dictionary management service 220 can determine whether a client device 110 is storing old and/or expired versions of the shared compression dictionary 222 every time the client device 110 transmits a write data to the dictionary management server 105 and/or a database server 115.

Figure 4:
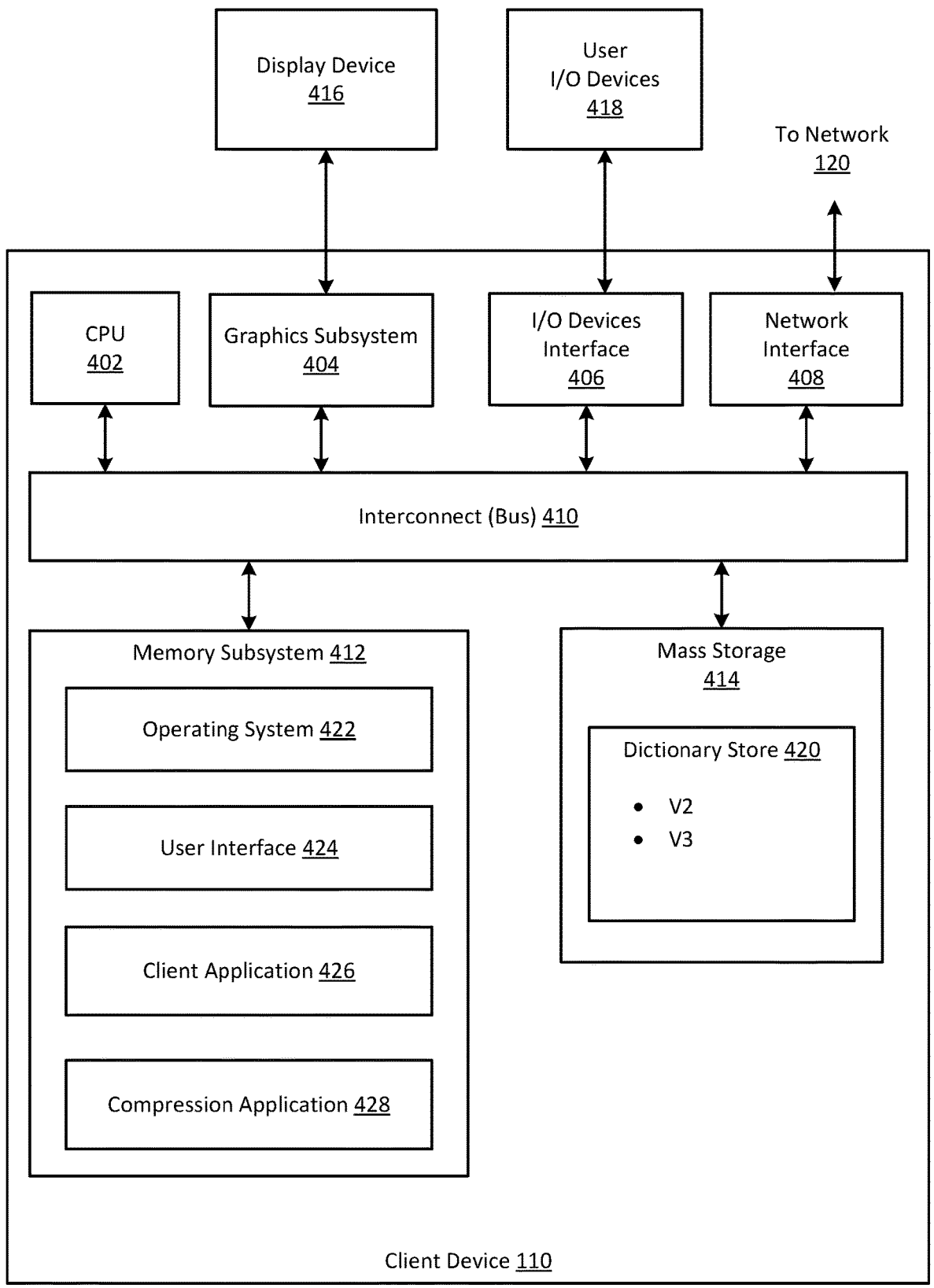
FIG. 4 is a block diagram of a client device that may be implemented in conjunction with the distributed database environment of FIG. 1, according to various embodiments of the present invention.

FIG. 4 is a block diagram of a client device 110 that may be implemented in conjunction with the distributed database environment 100 of FIG. 1, according to various embodiments of the present invention. As shown, the client device 110 may include, without limitation, a CPU 402, a graphics subsystem 404, an I/O device interface 406, a network interface 408, an interconnect 410, a memory subsystem 412, and a mass storage unit 414.

In some embodiments, the CPU 402 is configured to retrieve and execute programming instructions stored in the memory subsystem 412. Similarly, the CPU 402 is configured to store and retrieve application data (e.g., software libraries) residing in the memory subsystem 412. The interconnect 410 is configured to facilitate transmission of data, such as programming instructions and application data, between the CPU 402, graphics subsystem 404, I/O devices interface 406, network interface 408, memory subsystem 412, and mass storage unit 414.

In some embodiments, the graphics subsystem 404 is configured to generate frames of video data and transmit the frames of video data to display device 416. In some embodiments, the graphics subsystem 404 may be integrated into an integrated circuit, along with the CPU 402. The display device 416 may comprise any technically feasible means for generating an image for display. For example, the display device 416 may be fabricated using liquid crystal display (LCD) technology, cathode-ray technology, and light-emitting diode (LED) display technology. An input/output (I/O) device interface 406 is configured to receive input data from user I/O devices 418 and transmit the input data to the CPU 402 via the interconnect 410. For example, user I/O devices 418 may comprise one or more buttons, a keyboard, and a mouse or other pointing device. The I/O device interface 406 also includes an audio output unit configured to generate an electrical audio output signal. User I/O devices 418 includes a speaker configured to generate an acoustic output in response to the electrical audio output signal. In alternative embodiments, the display device 416 may include the speaker. A television is an example of a device known in the art that can display video frames and generate an acoustic output.

The network interface 408 is configured to transmit and receive packets of data via the network 120. For example, the network interface 408 is used to transmit write data from the client device 110 to the dictionary management server 105 and/or a database server 115. In some embodiments, the network interface 408 is configured to communicate using the well-known Ethernet standard. The network interface 408 is coupled to the CPU 402 via the interconnect 410.

A mass storage unit 414, such as a hard disk drive or flash memory storage drive, is configured to store non-volatile data. For example, the mass storage unit 414 stores versions of the shared compression dictionary 222 in a dictionary store 420. In the illustrated example, V2 and V3 of the shared compression dictionary 222 are stored in the dictionary store 420.

In some embodiments, the memory subsystem 412 includes programming instructions and application data that comprise an operating system 422, a user interface 424, a client application 426, and a compression application 428. The operating system 422 performs system management functions such as managing hardware devices including the network interface 408, mass storage unit 414, I/O device interface 406, and graphics subsystem 404. The operating system 422 also provides process and memory management models for the user interface 424, the client application 426, and the compression application 428. The user interface 424, such as a window and object metaphor, provides a mechanism for user interaction with client device 110. Persons skilled in the art will recognize the various operating systems and user interfaces that are well-known in the art and suitable for incorporation into the client device 110.

In some embodiments, the client application 426 writes data to the database servers 115. In some embodiments, the client application 426 retrieves data from the dictionary management server 105 and/or the database servers 115. In some embodiments, the compression application 428 compresses, using a version of the shared compression dictionary 222 stored in dictionary store 420, write data generated by the client application 426. For example, in response to an instruction from the client application 426, the compression application 428 compresses, using a version of the shared compression dictionary 222 stored in dictionary store 420, write data generated by the client application 426. In some embodiments, the compression application 428 decompresses data retrieved, by the client application 426, from the dictionary management server 105 and/or a database server 115. Compression application 428 may use any known dictionary-based compression algorithm, such as zstd or LZ4, when compressing write data received from client devices 110

In some embodiments, the client application 426 stores, in the dictionary store 420, a new version of the shared compression dictionary 222 received from the dictionary management server 105. In some embodiments, the client application 426 instructs compression application 428 to compress write data with a primary version of the shared compression dictionary 222 in response to an instruction received from the dictionary management server 105. In some embodiments, the client application 426 deletes a version of the shared compression dictionary 222 from the dictionary store 420 in response to an instruction from the dictionary management server 105.

Figure 5:
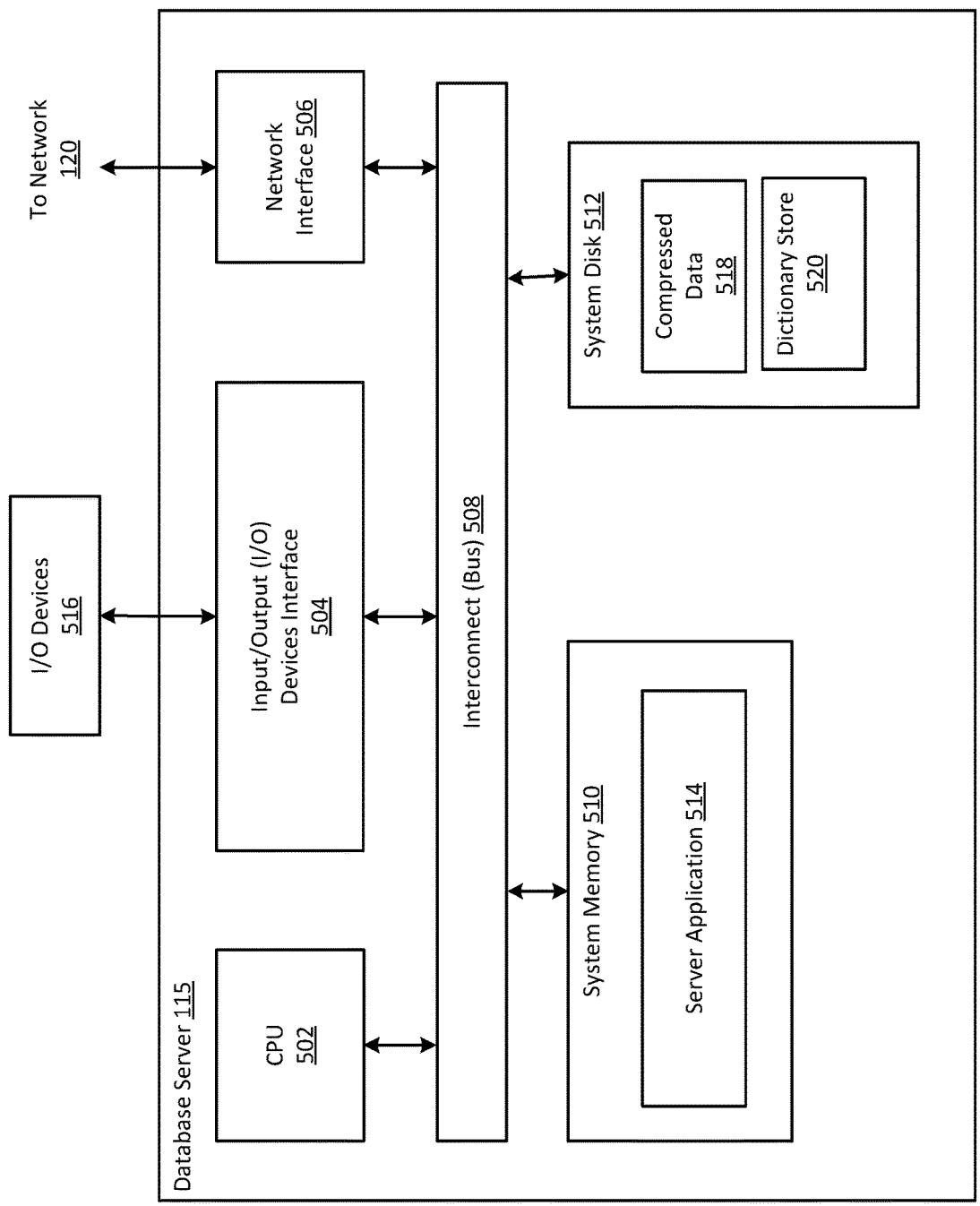
FIG. 5 is a block diagram of a database server that may be implemented in conjunction with the distributed database environment of FIG. 1, according to various embodiments of the present invention.

FIG. 5 is a block diagram of a database server 115 that may be implemented in conjunction with the distributed database environment 100 of FIG. 1, according to various embodiments of the present invention. As described above, in some embodiments, the database server 115 is configured to perform one or more of the dictionary management functions described herein with respect to the dictionary management server 105. In such embodiments, the database server 115 executes a dictionary management service, such as dictionary management service 220. In some embodiments, the dictionary management server 105 is integrated within one or more of the database servers 115. In some embodiments, the dictionary management service 220 runs on one or more of the database servers 115 and on a dictionary management server 105.

As shown in FIG. 5, the database server 115 includes, without limitation, a central processing unit (CPU) 502, an input/output (I/O) devices interface 504, a network interface 506, an interconnect 508, a system memory 510, and a system disk 512. The CPU 502 is configured to retrieve and execute programming instructions, such as server application 514, stored in the system memory 510. Similarly, the CPU 502 is configured to store application data (e.g., software libraries) and retrieve application data from the system memory 510. The interconnect 508 is configured to facilitate transmission of data, such as programming instructions and application data, between the CPU 502, I/O devices interface 504, the network interface 506, the system memory 510, and the system disk 512. The I/O devices interface 504 is configured to receive input data from I/O devices 516 and transmit the input data to the CPU 502 via the interconnect 508. For example, I/O devices 516 may include one or more buttons, a keyboard, a mouse, and/or other input devices. The I/O devices interface 504 is further configured to receive output data from the CPU 502 via the interconnect 508 and transmit the output data to the I/O devices 516.

The system disk 512 may include one or more hard disk drives, solid state storage devices, or similar storage devices. The system disk 512 is configured to store non-volatile data such as files (e.g., audio files, video files, subtitles, application files, software libraries, etc.). The system disk 512 is configured to store compressed data 518 transmitted by the dictionary management server 105 and/or client devices 110. The compressed data 518 can be retrieved by the dictionary management server 105 and/or one or more client devices 110 via the network 120. In some embodiments, the network interface 506 is configured to operate in compliance with the Ethernet standard. In some embodiments, the system disk 512 includes a dictionary store 520 that stores one or more versions of the shared compression dictionary 222.

The system memory 510 includes a server application 514 that services requests for compressed data 518 received from client devices 110 and other database servers 115. When the server application 514 receives a request for compressed data 518, the server application 514 retrieves the corresponding compressed data 518 from the system disk 512 and transmits the compressed data 518 to the dictionary management server 105, a client device 110, or a database server 115 via the network 120. In some embodiments, the server application 514 transmits the compressed data 518 to dictionary management server 105, which forwards the compressed data 518 to one or more client devices 110.

Figure 6:
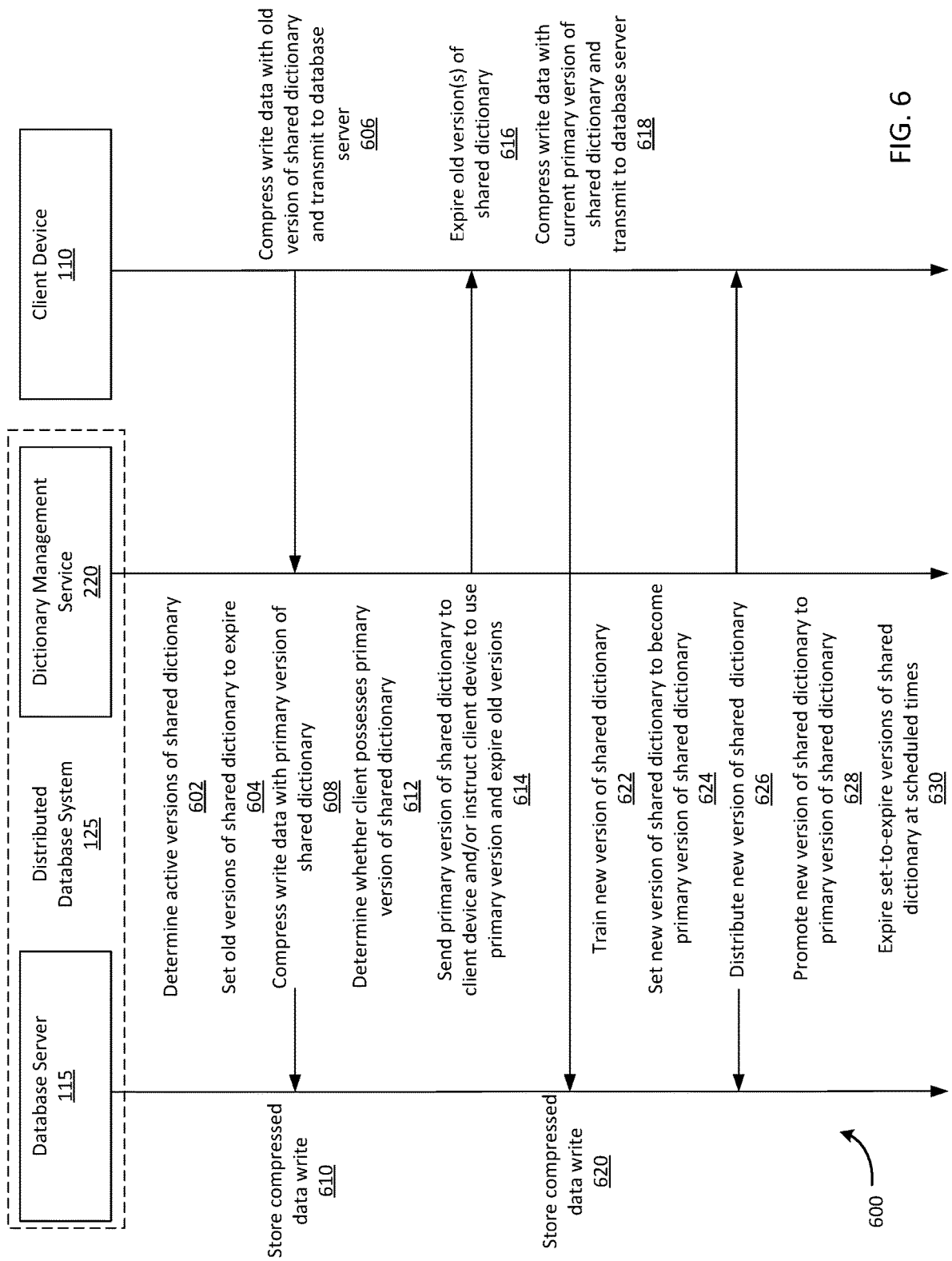
FIG. 6 illustrates an example flow diagram showing a process for managing use of a shared compression dictionary in distributed database environment of FIG. 1, according to various embodiments.

FIG. 6 illustrates an example flow diagram showing a process 600 for managing use of a shared compression dictionary in a distributed database environment, according to various embodiments. Although the interaction between the devices in process 600 are shown in an order, persons skilled in the art will understand that the interactions may be performed in a different order, interactions may be repeated or skipped, and/or may be performed by components other than those described in FIG. 6. Furthermore, in the illustrated example of FIG. 6, a distributed database system 125 is shown as including a database server 115 and a dictionary management service 220. As described above, persons skilled in the art will understand that the dictionary management service 220 shown in FIG. 6 could be executed on a dictionary management server 105, the illustrated database server 115, and/or on one or more other database servers 115.

Process 600 begins at step 602 at which the dictionary management service 220 determines a list of active dictionary versions 304 in the distributed database environment 100. As described above, the list of active dictionary versions 304 includes a list of all active versions of the shared compression dictionary 222 that were used to compress data currently stored in the database servers 115. With respect to the illustrated example of FIG. 3, the list of active dictionary versions 304 includes V1, V2, and V3 of the shared compression dictionary 222.

In some embodiments in which dictionary management service 220 is running on one or more database servers 115, dictionary management service 220 determines the list of active dictionary versions 304 by determining which versions of the shared compression dictionary 222 were used to compress data currently stored in the one or more database servers 115. In some embodiments, dictionary management service 220 determines the list of active dictionary versions 304 based on in-band signaling between the dictionary management server 105 and the database servers 115. In such embodiments, the versions of the shared compression dictionary 222 that are active in a respective database server 115 are indicated in the metadata, or some other portion, of the signals transmitted by the database server 115 to the dictionary management server 105. Accordingly, in such embodiments, dictionary management service 220 determines, or updates, the list of active dictionary versions 304 each time a signal is received from a database server 115 based on the metadata included in the received signal. In other embodiments, dictionary management service 220 determines the list of active dictionary versions 304 by polling the database servers 115. In response to the polling, the database servers 115 respectively indicate which versions of the shared compression dictionary 222 are active. In such embodiments, dictionary management service 220 polls the database servers 115 for this information periodically (e.g., every 30 seconds, every minute, every half hour, every hour, etc.) or on an ad-hoc basis.

At step 604, the dictionary management service 220 sets, or schedules, old versions of the shared compression dictionary 222 to expire when that version of the shared compression dictionary 222 is no longer needed to compress new write data. For example, the dictionary management service 220 schedules an old version of the shared compression dictionary 222 to expire after demoting that version of the shared compression dictionary 222 from being the primary version of the shared compression dictionary 222. The dictionary management service 220 schedules an expiration time at which a respective version of the shared compression dictionary 222 will be expired such that there is enough time for data currently stored in the database servers 115 that was compressed with the set-to-expire version of the shared compression dictionary 222 to be compacted and/or recompressed with a different version (e.g., the primary version) of the shared compression dictionary 222. With respect to the illustrated example of FIG. 3, dictionary management service 220 has scheduled V1 of the shared compression dictionary 222 to expire at 1:00 on March 14 and V2 of the shared compression dictionary 222 to expire at 1:00 on March 21.

At step 606, a client device 110 compresses a write data with an old version of the shared compression dictionary 222 and transmits the compressed write data to be stored in a database server 115. For example, the client device 110 compresses the write data using compression application 428 and transmits the compressed write data using client application 426. The old version of the shared compression dictionary 222 is stored in the dictionary store 420 of the client device 110. In some embodiments, the old version of the shared compression dictionary 222 with which the client device 110 compressed the write data is a version of the shared compression dictionary 222 that has been set to expire and/or demoted from the primary version by the dictionary management service 220. With respect to the illustrated examples of FIGS. 3 and 4, it will be assumed that the client device 110 compressed the write data with V2 of the shared compression dictionary 222 before transmitting the write data for storage in a database server 115. In this example, V2 of the shared compression dictionary 222 has been set to expire at 1:00 on March 21 by the dictionary management service 220.

At step 608, the dictionary management service 220 detects that the write data transmitted at step 606 was compressed with an old version of (e.g., V2) of the shared compression dictionary 222. In response, the dictionary management service 220 instructs the compression application 218 to recompress the write data transmitted by the client device at step 606 with the current primary version of the shared compression dictionary 222 before storing the write data in a database server 115. With respect to the illustrated example of FIG. 3, the dictionary management service 220 instructs the compression application 218 to recompress the write data transmitted by the client device at step 606 with V3 of the shared compression dictionary 222. After the write data is compressed with the current primary version of the shared compression dictionary 222, process 600 proceeds to step 610 at which the dictionary management service 220 stores the compressed write data in a database server 115.

As described above with respect to step 608, dictionary management service 220 detects instances in which write data transmitted by a client device 110 is compressed with an old version of the shared compression dictionary 222. Moreover, dictionary management service 220 detects instances in which a client device transmits a write data that was not compressed with the current primary version of the shared compression dictionary 222. In such instances, a client device 110 may not compress a write data with the current primary version of the shared compression dictionary 222 because the client device 110 does not possess the current primary version of the shared compression dictionary 222 and/or the client device 110 has not received an instruction to compress new write data with the current primary version of the shared compression dictionary 222 from the dictionary management service 220. For example, in such instances, the client device 110 may be a new client device 110 in the distributed database environment 100 and/or may have been offline when the dictionary management service 220 transmitted an instruction causing the other client devices 110 compress new write data with the current primary version of the shared compression dictionary 222.

At step 612, the dictionary management service 220 determines whether the client device 110 that transmitted the write data, which was not compressed with the current primary version of the shared compression dictionary 222 at step 606, possesses the current primary version of the shared compression dictionary 222. In some embodiments, the dictionary management service 220 determines whether the client device 110 possesses the current primary version of the shared compression dictionary 222 based on metadata of the write data transmitted by the client device 110 at step 606. In such embodiments, the dictionary management server 105 and the client device 110 implement in-band signaling in which a list of versions of the shared compression dictionary that are possessed by the client device 110 is included in the metadata, or some other portion, of a signal transmitted by the client device 110 to the dictionary management service 220 running on dictionary management server 105 and/or a database server 115. That is, in such embodiments, metadata included in signals transmitted by a client device 110 indicates a list of versions of the shared compression dictionary 222 that are currently possessed by the client device 110.

Accordingly, in such embodiments, the dictionary management service 220 determines whether the client device 110 possesses the current primary version of the shared compression dictionary 222 based on this list included in the metadata, or some other portion, of the signal transmitted by the client device 110. In addition, the dictionary management service 220 can also determine whether the client device 110 possesses any old versions of the shared compression dictionary 222 that have been set to expire or have expired based on this list included in the metadata, or some other portion, of the signal transmitted by the client device 110.

FIG. 7 illustrates an example signal 700 transmitted from the client device 110 to the dictionary management service 220. Signal 700 is, for example, the signal transmitted by the client device 110 at step 606 of FIG. 6 described above. As shown, the signal 700 includes a data portion 705 that includes the write data and a metadata portion 710 that includes the list of versions of the shared compression dictionary 222 that are currently possessed by the client device 110. In this example, the list included in the metadata portion 710 indicates that the client device 110 possesses only V2 of the shared compression dictionary 222. With respect to the illustrated example of FIG. 3, V2 is not the current primary version of the shared compression dictionary 222 and instead has been set to expire by the dictionary management service 220. Accordingly, in the example of FIG. 7, dictionary management service 220 determines, based on the metadata portion 710 of the signal 700, that the client device 110 does not possess the current primary version of the shared compression dictionary 222 and that the client device 110 possesses a version (e.g., V2) of the shared compression dictionary 222 that has been set to expire.

In some embodiments, dictionary management service 220 determines whether the client device 110 possesses the current primary version of the shared compression dictionary 222 by polling the client device 110 to indicate which versions of the shared compression dictionary 222 are possessed by the client device 110. For example, after receiving write data transmitted at step 606, which was not compressed with the current primary version of the shared compression dictionary 222, the dictionary management service 220 polls the client device 110 to provide a list of versions of the shared compression dictionary 222 that are possessed by the client device 110. In response to the poll, the client device 110 transmits a list of versions of the shared compression dictionary 222 that are possessed by client device 110. Accordingly, the dictionary management service 220 determines whether the client device 110 possesses the current primary version of the shared compression dictionary 222 and/or any expired or set-to-expire versions of the shared compression dictionary 222 based on the list included in the response of the client device 110 to the poll.

In other embodiments, the dictionary management service 220 simply determines that a client device 110 does not possess the current primary version of the shared compression dictionary 222 whenever a client device 110 transmits write data that is not compressed with the current primary version of the shared compression dictionary 222. In such embodiments, the dictionary management service 220 does not verify this by checking a list of versions of the shared compression dictionary 222 that are possessed by the client device 110.

When the dictionary management service 220 determines the client device 110 does not possess the current primary version of the shared compression dictionary 222 at step 612, at step 614, the dictionary management service 220 transmits a signal including the current primary version of the shared compression dictionary 222 to the client device 110. This signal may also include, or be accompanied by one or more additional signals that include, an instruction to the client device 110 to compress new write data with the current primary version of the shared compression dictionary 222 and/or an instruction to the client device 110 to expire old versions of the shared compression dictionary 222 that are expired or have been set to expire.

In some embodiments, the instruction to the client device 110 to compress new write data with the current primary version of the shared compression dictionary 222 is an explicit instruction transmitted by the dictionary management service 220. In such embodiments, after detecting that a write data transmitted by the client device 110 was not compressed with the current primary version of the shared compression dictionary 222, the dictionary management service 220 transmits a signal that explicitly instructs the client device 110 to compress new write data with the current primary version of the shared compression dictionary 222. Similarly, in some embodiments, the instruction to the client device 110 to expire old versions of the shared compression dictionary 222 that are possessed by the client device 110 is an explicit instruction transmitted by the dictionary management service 220. In such embodiments, after detecting that the client device 110 possesses one or more old versions of the shared compression dictionary 222 that have expired or have been set to expire, the dictionary management service 220 may transmit a signal that explicitly instructs the client device 110 to expire these one or more old versions of the shared compression dictionary 222. With respect to illustrated example of FIG. 4, the client device 110 possesses V2 of the shared compression dictionary 222. Since V2 of the shared compression dictionary 222 has been set to expire, the dictionary management service 220 would transmit an explicit instruction to the client device 110 to expire V2 the shared compression dictionary 222.

In other embodiments, the instruction to the client device 110 to compress new write data with the current primary version of the shared compression dictionary 222 and/or the instruction to the client device 110 to expire old versions of the shared compression dictionary 222 that are possessed by the client device 110 are implicit instructions. In such embodiments, dictionary management service 220 implements in-band signaling to transmit signals including the implicit instructions to the client device 110. For example, in such embodiments, the implicit instructions may be included in the metadata, or some other portion, of a signal transmitted by the dictionary management service 220 to the client device 110. That is, in such embodiments, an indication of the current primary version of the shared compression dictionary 222 and/or a list of versions of the shared compression dictionary 222 that are set to expire are included in the metadata, or some other portion, of signals transmitted by the dictionary management service 220 to the client devices 110 and/or database servers 115.

Thus, when a client device 110 receives a signal from the dictionary management service 220, the client device 110 can determine, based on the metadata included in the signal, which version is the primary version of the shared compression dictionary 222 that should be used to compress new write data. When the client device 110 determines the current primary version of the shared compression dictionary 222 based on the metadata in a signal transmitted by the dictionary management service 220, the client device 110 interprets receipt of the signal as an implicit instruction to compress new write data with the current primary version of the shared compression dictionary 222. Similarly, the client device 110 can also determine, based on the metadata included in the signal, whether the client device 110 is in possession of the of any versions of the shared compression dictionary 222 that should be expired. When the client device 110 determines, based on the metadata in a signal transmitted by the dictionary management service 220, that the client device 110 possesses one or more versions of the shared compression dictionary 222 that have expired or have been set to expire, the client device 110 interprets receipt of the signal as an implicit instruction to expire the old versions of the shared compression dictionary 222 that are possessed by the client device 110.

Referring back to process 600, in instances in which the dictionary management service 220 determines the client device 110 does possess the current primary version of the shared compression dictionary 222 at step 612, the dictionary management service 220 does not transmit a signal including the current primary version of the shared compression dictionary 222 to the client device 110 at step 614. Instead, in such instances, the dictionary management service 220 transmits an instruction to the client device 110 to compress new write data with the current primary version of the shared compression dictionary 222 and/or an instruction to the client device 110 to expire old versions of the shared compression dictionary 222 at step 614 without transmitting a signal including the current primary version of the shared compression dictionary 222. In such instances, the dictionary management service 220 does not resend the current primary version of the shared compression dictionary 222 to the client device 110 that already possesses the current primary version of the shared compression dictionary 222 to avoid wasting bandwidth resources of network 120.

FIG. 8 illustrates an example signal 800 transmitted from the dictionary management service 220 to the client device 110. Signal 800 is, for example, the signal transmitted by the dictionary management service 220 to the client device 110 at step 614. As shown, the signal 800 includes a data portion 805 and a metadata portion 810. The data portion 805 includes the current primary version of the shared compression dictionary 222 and/or other data, such as a read data, that may be transmitted from the dictionary management service 220 to the client device 110. For example, the data portion 805 may include the current primary version of the shared compression dictionary 222 for instances in which the dictionary management service 220 determines, at step 612, that the client device 110 does not possess the current primary version of the shared compression dictionary 222. As another example, the data portion 805 would not include the current primary version of the shared compression dictionary 222 for instances in which the dictionary management service 220 determines, at step 612, that the client device 110 does possess the current primary version of the shared compression dictionary 222.

The metadata portion 810 includes an indication as to which version of the shared compression dictionary 222 is the current primary version of the shared compression dictionary 222. With respect to the illustrated examples of FIGS. 3 and 8, the metadata portion 810 indicates that V3 is the current primary version of the shared compression dictionary 222. In addition, the metadata portion 810 includes an indication as to which versions of the shared compression dictionary 222 have been set to expire by the dictionary management service 220. Although not shown, the indication as to which versions of the shared compression dictionary 222 have been set to expire can further include the respective scheduled expiration times for each of the set-to-expire versions of the shared compression dictionary 222. With respect to the illustrated examples of FIGS. 3 and 8, the metadata portion 810 indicates that V1 and V2 of the shared compression dictionary 222 have been set to expire by the dictionary management service 220.

Referring back to process 600, in response to receiving the one or more signals transmitted by the dictionary management service 220 at step 614, the client device 110 expires any old versions of the shared compression dictionary 222 that have been set to expire by the dictionary management service 220 and remain in possession of the client device 110 at step 616. That is, based on the one or more signals transmitted by the dictionary management service 220 at step 614, at step 616, the client device 110 expires any set-to-expire versions of the shared compression dictionary 222 that are possessed by the client device 110. In operation, client application 426 executing on the client device 110 expires any set-to-expire versions of the shared compression dictionary 222 that are stored in the dictionary store 420.

When the client device 110 expires a set-to-expire version of the shared compression dictionary 222, the client device 110 stops compressing new write data with the set-to-expire version of the shared compression dictionary 222 and deletes the set-to-expire version of the shared compression dictionary 222 from the dictionary store 420 included in mass storage unit 414 of the client device 110. In some instances, the client device 110 automatically stops compressing new write data with the set-to-expire version and deletes the set-to-expire version from the dictionary store 420 in response to receiving the one or more signals transmitted by the dictionary management service 220 at step 614. In other instances, the client device 110 stops compressing new write data with the set-to-expire version and deletes the set-to-expire version from the dictionary store 420 at the scheduled expiration time of the set-to-expire version of the shared compression dictionary 222. With respect to the illustrated examples of FIGS. 3 and 4, the client device 110 would stop compressing new write data with V2 of the shared compression dictionary 222 and delete V2 of the shared compression dictionary 222 from the dictionary store 420 at 1:00 on March 21.

For embodiments in which the dictionary management service 220 transmits an explicit instruction to the client device 110 to expire a set-to-expire version of the shared compression dictionary 222, the client device 110 expires the set-to-expire version of the shared compression dictionary 222 in response to receiving the explicit instruction. For embodiments in which the dictionary management service 220 transmits an implicit instruction to the client device 110 to expire a set-to-expire version of the shared compression dictionary 222, for example using in-band signaling, the client device 110 determines to expire the set-to-expired version of the shared compression dictionary 222 based on the metadata included in the one or more signals transmitted by the dictionary management service 220 at step 614. For example, in response to receiving signal 800, the client device 110 detects that V2 is indicated by the metadata portion 810 as being a set-to-expire version of the shared compression dictionary 222. Accordingly, in this example, client device 110 expires V2 of the shared compression dictionary 222.

Referring back to process 600, at step 618, the client device 110 compresses a new write data with the current primary version of the shared compression dictionary 222 and transmits the compressed write data for storage in a database server 115. In operation, client application 426 executing on the client device 110 instructs the compression application 428 to compress the new write data with the current primary version of the shared compression dictionary 222 before transmitting the write data to a database server 115 for storage. The client device 110 begins compressing new write data, such as the write data transmitted at step 618, with the current primary version of the shared compression dictionary 222 in response to receiving the one or more signals transmitted by the dictionary management service 220 at step 614. In addition, for instances in which the dictionary management service 220 transmits the current primary version of the shared compression dictionary 222 at step 614 and the client device 110 did not previously possess the current primary version of the shared compression dictionary 222, the client device 110 also stores the current primary version of the shared compression dictionary 222 in the dictionary store 420 at step 618.

For embodiments in which the dictionary management service 220 transmits an explicit instruction to the client device 110 to compress new write data with the current primary version of the shared compression dictionary 222, the client device 110 compresses new write data with the current primary version of the shared compression dictionary 222 in response to receiving the explicit instruction. For embodiments in which the dictionary management service 220 transmits an implicit instruction to the client device 110 to compress new write data with the current primary version of the shared compression dictionary 222, for example using in-band signaling, the client device 110 determines to compress new write data with the current primary version of the shared compression dictionary 222 based on the metadata included in the one or more signals transmitted by the dictionary management service 220. With respect to the illustrated example of FIG. 8, in response to receiving signal 800, the client device 110 detects that V3 is indicated by the metadata portion 810 as being the current primary version of the shared compression dictionary 222. Accordingly, the client device 110 begins compressing new write data with V3 of the shared compression dictionary 222.

At step 620, the compressed write data transmitted by the client device 110 at step 618 is stored in a database server 115. Although the arrow from step 618 to step 620 in FIG. 6 indicates that the compressed write data is transmitted directly from the client device 110 to the database server 115 for storage, in some embodiments, the compressed write data is first checked by the dictionary management service 220 before the compressed write data is stored in the database server 115 at step 620. For example, in such embodiments, the dictionary management service 220 verifies that the compressed write data transmitted by the client device 110 at step 618 has been compressed with the current primary version of the shared compression dictionary 222 before the dictionary management service 220 proceeds to store the compressed write data in the database server 115.

In some instances, a client device 110 is incapable of compressing write data with the shared compression dictionary 222. For example, the client device 110 may operate in accordance with one or more protocols, programming languages, and/or hardware constraints that are not compatible with dictionary-based compression. In such instances, the client device 110 transmits uncompressed write data to the dictionary management service 220 and the dictionary management service 220 compresses the uncompressed write data with the current primary version of the shared compression dictionary 222 before storing the write data in a database server 115. Similarly, in some instances, a client device 110 is incapable of decompressing compressed read data that are retrieved from a database server 115. For example, the client device 110 may operate in accordance with one or more protocols, programming languages, and/or hardware constraints that are not compatible with dictionary-based decompression. In such instances, the dictionary management service 220 decompresses compressed read data retrieved from the database server 115 and then transmits the uncompressed read data to the client device 110.

Referring back to process 600, at step 622, the dictionary management service 220 creates, or trains, a new version of the shared compression dictionary 222. With respect to the illustrated example of FIG. 3, V4 of the shared compression dictionary 222 is an example of a new version of the shared compression dictionary 222 trained at step 622.

In some embodiments, the dictionary management service 220 trains a new version of the shared compression dictionary 222 periodically (e.g., weekly, monthly, bi-monthly, etc.). In some embodiments, the dictionary management service 220 trains a new version of the shared compression dictionary 222 when data stored in the database servers 115 undergo a compaction process, which reduces the amount of storage space consumed by data that is currently stored in the database servers 115. In such embodiments, data stored in the database servers 115 is compacted using the newly trained version of the shared compression dictionary 222. Moreover, in such embodiments, one or more of the database servers 115 contribute to training the new version of the shared compression dictionary 222 during the compaction process, which may occur periodically (e.g., weekly, monthly, bi-monthly, etc.). In some embodiments, the dictionary management service 220 trains a new version of the shared compression dictionary 222 in response to a trigger event. For example, the dictionary management service 220 may train a new version of the shared compression dictionary 222 in response to determining that compression ratios achieved with current primary version of the shared compression dictionary 222 have decreased below a target threshold. In some embodiments, the dictionary management service 220 trains a new version of the shared compression dictionary 222 as needed.

At step 624, the dictionary management service 220 sets, or schedules, the new version of the shared compression dictionary 222 to become the next primary version of the shared compression dictionary 222. With respect to the illustrated example of FIG. 3, the dictionary management service 220 sets V4 of the shared compression dictionary 222 to become the next primary version of the shared compression dictionary 222.

In some embodiments, scheduling a new version of the shared compression dictionary 222 to become the next primary version of the shared compression dictionary 222 includes scheduling a time at which the new version of the shared compression dictionary 222 will be promoted to the primary version of the shared compression dictionary 222. In such embodiments, the dictionary management service 220 schedules the time at which the new version of the shared compression dictionary 222 will be promoted to the primary version of the shared compression dictionary 222 to be a time that provides the client devices 110 and/or database servers 115 with enough time to retrieve the new version of the shared compression dictionary 222 before it is promoted to the primary version of the shared compression dictionary 222. For example, the dictionary management service 220 may schedule the promotion of the new version of the shared compression dictionary 222 to occur within minutes, hours, days, etc.

At step 626, the dictionary management service 220 distributes the new version of the shared compression dictionary 222 that is scheduled to become the next primary version of the shared compression dictionary 222 to the client devices 110 and/or database servers 115. In some embodiments, distributing the new version of the shared compression dictionary 222 includes transmitting the new version of the shared compression dictionary 222 to all client devices 110 and/or all database servers 115. In some embodiments, distributing the new version of the shared compression dictionary 222 includes transmitting the new version of the shared compression dictionary to a respective client device 110 or database server 115 in response to receiving a signal from that client device 110 or database server 115. In some embodiments, distributing the new version of the shared compression dictionary 222 includes implementing the polling and/or in-band signaling techniques for transmitting the current primary version of the shared compression dictionary 222 described above with respect to steps 612 and 614.

In some embodiments, distributing the new version of the shared compression dictionary 222 further includes instructing the client devices 110 and/or database servers 115 to start compressing new write data with the new version of the shared compression dictionary 222 at or after the scheduled time at which the new version of the shared compression dictionary 222 will be promoted to the primary version of the shared compression dictionary 222. Furthermore, in some embodiments, distributing the new version of the shared compression dictionary 222 includes instructing the client devices 110 and/or database servers 115 to expire old versions of the shared compression dictionary 222 that have been set to expire in accordance with the techniques described herein.

At step 628, the dictionary management service 220 promotes the new version of the shared compression dictionary 222 to the primary version of the shared compression dictionary 222 at the scheduled promotion time. For example, the dictionary management service 220 promotes V4 of the shared compression dictionary 222 to the primary version of the shared compression dictionary 222 at the scheduled promotion time for V4 of the shared compression dictionary.

At step 630, the dictionary management service 220 expires any old versions of the shared compression dictionary 222 at their respective scheduled expiration times. With respect to the illustrated example of FIG. 3, the dictionary management service 220 expires V1 of the shared compression dictionary 222 at 1:00 on March 14 and expires V2 of the shared compression dictionary 222 at 1:00 on March 21.

In some embodiments, after expiring a version of the shared compression dictionary 222, the dictionary management service 220 deletes the expired version of the shared compression dictionary 222 from the system disk 214. In some embodiments, after expiring a version of the shared compression dictionary 222, the dictionary management service 220 waits a predetermined amount of time (e.g., a week, a month, etc.) before deleting the expired version of the shared compression dictionary 222 from the system disk 214. In some embodiments, after expiring a version of the shared compression dictionary 222, the dictionary management service 220 does not delete the expired version of the shared compression dictionary 222 from the system disk 214. In some embodiments, after expiring a version of the shared compression dictionary 222, the dictionary management service 220 stores the expired version of the shared compression dictionary 222 in a separate server, such as a database server 115.

Figure 9:
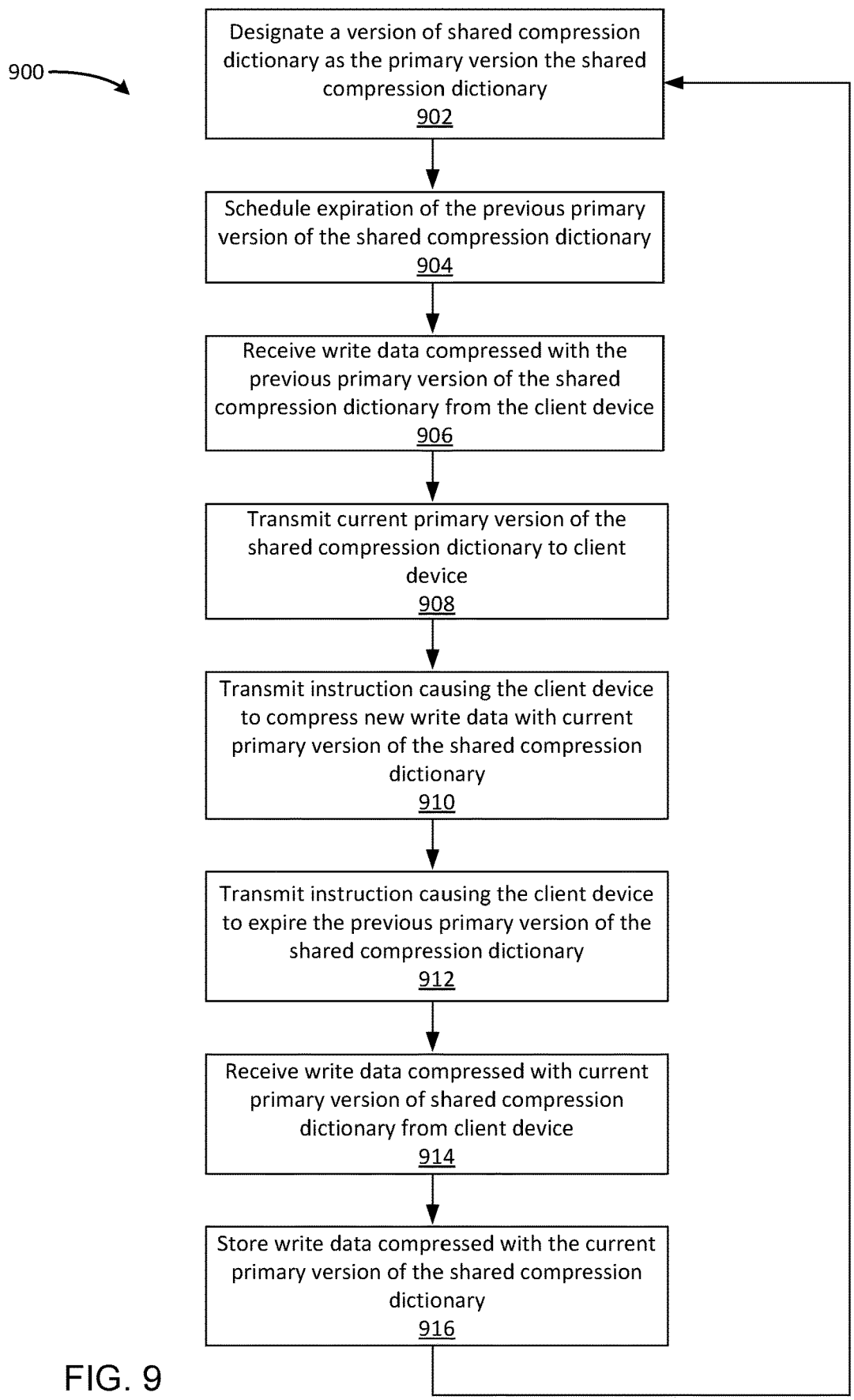
FIG. 9 is a flow diagram of method steps for managing use of a shared compression dictionary in a distributed database environment, according to various embodiments.

FIG. 9 is a flow diagram of method steps for managing use of a shared compression dictionary in a distributed database environment, according to various embodiments. Although the method steps are described with reference to the systems and processes of FIGS. 1-8, persons skilled in the art will understand that any system configured to implement the method steps, in any order, falls within the scope of the present invention.

As shown, a method 900 begins at step 902, where a version of the shared compression dictionary (e.g., shared compression dictionary 222) is designated as a current primary version of the shared compression dictionary. For example, referring to FIG. 3, V3 of the shared compression dictionary 222 is designated as, or promoted, to the primary version of the shared compression dictionary 222.

At step 904, expiration of a previous primary version of the shared compression dictionary is scheduled. For example, referring to FIG. 3, V2 of the shared compression dictionary 222 is scheduled to expire at 1:00 on March 21.

At step 906, write data that was compressed with the previous primary version of the shared compression dictionary is received from a client device (e.g., client device 110). For example, referring to FIGS. 6 and 7, dictionary management service 220 receives write data that was compressed with V2 of the shared compression dictionary 222 from the client device 110.

Responsive to receipt of the first write data, at step 908, the current primary version of the shared compression dictionary is transmitted to the client device. For example, referring to FIGS. 6 and 8, dictionary management service 220 transmits V3 of the shared compression dictionary 222 to the client device 110. Also responsive to receipt of the first write data, at step 910, an instruction to compress new write data with the current primary version of the shared compression dictionary is transmitted to the client device. For example, referring to FIGS. 6 and 8, dictionary management service 220 transmits an instruction to compress new write data with V3 of the shared compression dictionary 222 to the client device 110.

At step 912, an instruction to expire the previous primary version of the shared compression dictionary is transmitted to the client device. For example, referring to FIGS. 6 and 8, dictionary management service 220 transmits an instruction to expire V2 of the shared compression dictionary 222 to the client device 110.

At step 914, write data that was compressed with the current primary version of the shared compression dictionary is received from the client device. For example, referring to FIG. 6, dictionary management service 220 receives write data that was compressed with V3 of the shared compression dictionary 222 from the client device 110. At step 916, the write data that was compressed with the current primary version of the shared compression dictionary is stored in a database. For example, referring to FIGS. 1 and 6, dictionary management service 220 stores the write data that was compressed with V3 of the shared compression dictionary 222 in a database server 115.

In sum, the disclosed techniques manage shared compression dictionaries that are used for cooperative compression in a distributed database environment. In response to a trigger event, such as a compression ratio of a current version of a primary dictionary decreasing below a threshold or a passage of a predetermined period of time, a server creates a new version of the shared compression dictionary to be used for cooperative compression. After creating the new version of the shared compression dictionary, the server promotes the new version to become the primary version of the shared compression dictionary. Thereafter, the server shares the new primary version of the shared compression dictionary with one or more clients. Then, the server causes the one or more clients to expire any stored versions of the shared compression dictionary that are older than the primary version of the shared compression dictionary. Further, the server causes the one or more clients to decompress read data and compress write data using the primary version of the shared compression dictionary.

At least one technical advantage of the disclosed techniques relative to the prior art is that, in the disclosed techniques, effective compression can be achieved primarily with client-side compression without the drawbacks associated with conventional client-side or server-side compression methods. In particular, in the disclosed techniques, all shared dictionaries are managed on the database server side. In this regard, the risk of losing data stored in the database because a client inadvertently expired or otherwise lost a dictionary that was used to compress the stored data is eliminated. Moreover, by managing the shared dictionaries on the server side, database servers can instruct all clients of the database to start using new dictionaries and/or to expire old dictionaries, thereby reducing the amount of client-side storage that is wasted on storing dictionaries that are not in use. At least another technical advantage of the disclosed techniques relative to the prior art is that, in the disclosed techniques, database servers can re-write stored data using newer versions of the shared compression dictionary during routine compaction processes. In this regard, old versions of the shared compression dictionary can be expired deterministically as the database servers re-write, using newer versions of the shared compression dictionary, data that was compressed with the old versions of the shared compression dictionary.

1. In some embodiments, a computer-implemented comprises determining that a given version of a shared compression dictionary should be designated as a current primary version of the shared compression dictionary; receiving, from a client device, a first write data compressed with a previous primary version of the shared compression dictionary; in response to receiving the first write data, transmitting, to the client device, the current primary version of the shared compression dictionary and an instruction to compress new write data with the current primary version of the shared compression dictionary; receiving, from the client device, a second write data compressed with the current primary version of the shared compression dictionary; and storing the second write data in a database.

2. The computer-implemented method of clause 1, wherein receiving the first write data further comprises determining that the client device does not possess the current primary version of the shared compression dictionary.

3. The computer-implemented method of clauses 1 or 2, wherein determining that the client device does not possess the current primary version of the shared compression dictionary further comprises receiving metadata associated with the first write data, wherein the metadata includes a list of versions of the shared compression dictionary possessed by the client device; and determining that the current primary version of the shared compression dictionary is not included in the list of versions of the shared compression dictionary.

4. The computer-implemented method of any of clauses 1-3, further comprising in response to determining the first write data was compressed with the previous primary version of the shared compression dictionary, compressing the first write data with the current primary version of the shared compression dictionary; and storing the first write data in the database.

5. The computer-implemented of any of clauses 1-4, wherein the instruction to compress new write data with the current primary version of the shared compression dictionary is included in metadata of a signal transmitted to the client device.

6. The computer-implemented of any of clauses 1-5, further comprising transmitting a second instruction causing the client device to delete the previous primary version of the shared compression dictionary from storage of the client device.

7. The computer-implemented of any of clauses 1-6, wherein the second instruction to delete the previous primary version of the shared compression dictionary is included in metadata of a signal transmitted to the client device.

8. The computer-implemented of any of clauses 1-7, wherein determining that the given version of the shared compression dictionary should be designated as the current primary version of the shared compression dictionary further comprises training the given version of the shared compression dictionary; and designating the given version of the shared compression dictionary as the current primary version of the shared compression dictionary in response to determining that a compression ratio achieved with the previous primary version of the shared compression dictionary is less than a threshold.

9. The computer-implemented of any of clauses 1-8, wherein determining that the given version of the shared compression dictionary should be designated as the current primary version of the shared compression dictionary further comprises training the given version of the shared compression dictionary during a compaction process.

10. The computer-implemented of any of clauses 1-9, further comprising expiring the previous primary version of the shared compression dictionary.

11. In some embodiments, one or more non-transitory computer-readable storage media including instructions that, when executed by one or more processors, cause the one or more processors to perform the steps of determining that a given version of a shared compression dictionary should be designated as a current primary version of the shared compression dictionary; receiving, from a client device, first write data compressed with a previous primary version of the shared compression dictionary; in response to receiving the first write data, transmitting, to the client device, an instruction to compress new write data with the current primary version of the shared compression dictionary; receiving, from the client device, a second write data compressed with the current primary version of the shared compression dictionary; and storing the second write data in a database.

12. The one or more non-transitory computer-readable media of clause 11, wherein the instructions further cause the one or more processors to perform the steps of determining that the client device does not possess the current primary version of the shared compression dictionary; and in response to determining that the client device does not possess the current primary version of the shared compression dictionary, transmitting, to the client device, the current primary version of the shared compression dictionary.

13. The one or more non-transitory computer-readable media of clauses 11 or 12, wherein determining that the client device does not possess the current primary version of the shared compression dictionary further comprises receiving metadata associated with the first write data, wherein the metadata includes a list of versions of the shared compression dictionary possessed by the client device; and determining that the current primary version of the shared compression dictionary is not included in the list of versions of the shared compression dictionary.

14. The one or more non-transitory computer-readable media of any of clauses 11-13, wherein the instructions further cause the one or more processors to perform the steps of in response to determining the first write data was compressed with the previous primary version of the shared compression dictionary, compressing the first write data with the current primary version of the shared compression dictionary; and storing the first write data in the database.

15. The one or more non-transitory computer-readable media of any of clauses 11-14, wherein the instruction to compress new write data with the current primary version of the shared compression dictionary is included in metadata of a signal transmitted to the client device.

16. The one or more non-transitory computer-readable media of any of clauses 11-15, wherein the instructions further cause the one or more processors to perform the step of transmitting a second instruction causing the client device to delete the previous primary version of the shared compression dictionary from storage of the client device.

17. The one or more non-transitory computer-readable media of any of clauses 11-16, wherein the second instruction to delete the previous primary version of the shared compression dictionary is included in metadata of a signal transmitted to the client device.

18. The one or more non-transitory computer-readable media of any of clauses 11-17, wherein the instructions further cause the one or more processors to perform the steps of scheduling a time for expiring the previous primary version of the shared compression dictionary; and expiring the previous primary version of the shared compression dictionary at the scheduled time.

19. In some embodiments, a system comprising a memory storing a dictionary management service; and a processor coupled to the memory, wherein when executed by the processor, the dictionary management service causes the processor to determine that a given version of a shared compression dictionary should be designated as a current primary version of the shared compression dictionary, wherein the shared compression dictionary is shared across a plurality of devices; receive, from a client device included in the plurality of devices, first write data compressed with a previous primary version of the shared compression dictionary; transmit, to the client device, the current primary version of the shared compression dictionary and an instruction to compress new write data with the current primary version of the shared compression dictionary; receive, from the client device, a second write data compressed with the current primary version of the shared compression dictionary; and store the second write data in a database.

20. The system of clause 19, further comprising a server that includes the processor and the database.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention has been described above with reference to specific embodiments. Persons of ordinary skill in the art, however, will understand that various modifications and changes may be made thereto without departing from the broader spirit and scope of the invention as set forth in the appended claims. For example, and without limitation, although many of the descriptions herein refer to specific types of application data, content servers, and client devices, persons skilled in the art will appreciate that the systems and techniques described herein are applicable to other types of application data, content servers, and client devices. The foregoing description and drawings are, accordingly, to be regarded in an illustrative rather than a restrictive sense.

What is claimed is:

1. A computer-implemented method, comprising:
    determining that a given version of a shared compression dictionary should be designated as a current primary version of the shared compression dictionary;
    receiving, from a client device, a first write data compressed with a previous primary version of the shared compression dictionary;
    in response to receiving the first write data, transmitting, to the client device, the current primary version of the shared compression dictionary and an instruction to compress new write data with the current primary version of the shared compression dictionary;
    receiving, from the client device, a second write data compressed with the current primary version of the shared compression dictionary; and
    storing the second write data in a database.

2. The method of claim 1, wherein receiving the first write data further comprises determining that the client device does not possess the current primary version of the shared compression dictionary.

3. The method of claim 2, wherein determining that the client device does not possess the current primary version of the shared compression dictionary further comprises:
    receiving metadata associated with the first write data, wherein the metadata includes a list of versions of the shared compression dictionary possessed by the client device; and determining that the current primary version of the shared compression dictionary is not included in the list of versions of the shared compression dictionary.

4. The method of claim 1, further comprising:
in response to determining the first write data was compressed with the previous primary version of the shared compression dictionary, compressing the first write data with the current primary version of the shared compression dictionary; and
storing the first write data in the database.

5. The method of claim 1, wherein the instruction to compress new write data with the current primary version of the shared compression dictionary is included in metadata of a signal transmitted to the client device.

6. The method of claim 1, further comprising transmitting a second instruction causing the client device to delete the previous primary version of the shared compression dictionary from storage of the client device.

7. The method of claim 6, wherein the second instruction to delete the previous primary version of the shared compression dictionary is included in metadata of a signal transmitted to the client device.

8. The method of claim 1, wherein determining that the given version of the shared compression dictionary should be designated as the current primary version of the shared compression dictionary further comprises:
training the given version of the shared compression dictionary; and
designating the given version of the shared compression dictionary as the current primary version of the shared compression dictionary in response to determining that a compression ratio achieved with the previous primary version of the shared compression dictionary is less than a threshold.

9. The method of claim 1, wherein determining that the given version of the shared compression dictionary should be designated as the current primary version of the shared compression dictionary further comprises:
training the given version of the shared compression dictionary during a compaction process.

10. The method of claim 1, further comprising expiring the previous primary version of the shared compression dictionary.

11. One or more non-transitory computer-readable storage media including instructions that, when executed by one or more processors, cause the one or more processors to perform the steps of:
determining that a given version of a shared compression dictionary should be designated as a current primary version of the shared compression dictionary;
receiving, from a client device, first write data compressed with a previous primary version of the shared compression dictionary;
in response to receiving the first write data, transmitting, to the client device, an instruction to compress new write data with the current primary version of the shared compression dictionary;
receiving, from the client device, a second write data compressed with the current primary version of the shared compression dictionary; and
storing the second write data in a database.

12. The one or more non-transitory computer-readable storage media of claim 11, wherein the instructions further cause the one or more processors to perform the steps of:
determining that the client device does not possess the current primary version of the shared compression dictionary; and
in response to determining that the client device does not possess the current primary version of the shared compression dictionary, transmitting, to the client device, the current primary version of the shared compression dictionary.

13. The one or more non-transitory computer-readable storage media of claim 12, wherein determining that the client device does not possess the current primary version of the shared compression dictionary further comprises:
receiving metadata associated with the first write data, wherein the metadata includes a list of versions of the shared compression dictionary possessed by the client device; and
determining that the current primary version of the shared compression dictionary is not included in the list of versions of the shared compression dictionary.

14. The one or more non-transitory computer-readable storage media of claim 11, wherein the instructions further cause the one or more processors to perform the steps of:
in response to determining the first write data was compressed with the previous primary version of the shared compression dictionary, compressing the first write data with the current primary version of the shared compression dictionary; and
storing the first write data in the database.

15. The one or more non-transitory computer-readable storage media of claim 11, wherein the instruction to compress new write data with the current primary version of the shared compression dictionary is included in metadata of a signal transmitted to the client device.

16. The one or more non-transitory computer-readable storage media of claim 11, wherein the instructions further cause the one or more processors to perform the step of transmitting a second instruction causing the client device to delete the previous primary version of the shared compression dictionary from storage of the client device.

17. The one or more non-transitory computer-readable storage media of claim 16, wherein the second instruction to delete the previous primary version of the shared compression dictionary is included in metadata of a signal transmitted to the client device.

18. The one or more non-transitory computer-readable storage media of claim 11, wherein the instructions further cause the one or more processors to perform the steps of:
scheduling a time for expiring the previous primary version of the shared compression dictionary; and
expiring the previous primary version of the shared compression dictionary at the scheduled time.

19. A system comprising:
a memory storing a dictionary management service; and
a processor coupled to the memory, wherein when executed by the processor, the dictionary management service causes the processor to:
determine that a given version of a shared compression dictionary should be designated as a current primary version of the shared compression dictionary, wherein the shared compression dictionary is shared across a plurality of devices;
receive, from a client device included in the plurality of devices, first write data compressed with a previous primary version of the shared compression dictionary;
transmit, to the client device, the current primary version of the shared compression dictionary and an instruction to compress new write data with the current primary version of the shared compression dictionary;

receive, from the client device, a second write data compressed with the current primary version of the shared compression dictionary; and store the second write data in a database.

20. The system of claim 19, further comprising a server that includes the processor and the database.

* * * * *